US008247904B2

(12) United States Patent
Bangsaruntip et al.

(10) Patent No.: US 8,247,904 B2
(45) Date of Patent: Aug. 21, 2012

(54) INTERCONNECTION BETWEEN SUBLITHOGRAPHIC-PITCHED STRUCTURES AND LITHOGRAPHIC-PITCHED STRUCTURES

(75) Inventors: Sarunya Bangsaruntip, Yorktown Heights, NY (US); Daniel C. Edelstein, Yorktown Heights, NY (US); William D. Hinsberg, San Jose, CA (US); Ho-Cheol Kim, San Jose, CA (US); Steven Koester, Yorktown Heights, NY (US); Paul M. Soloman, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 442 days.

(21) Appl. No.: 12/540,759

(22) Filed: Aug. 13, 2009

(65) Prior Publication Data
US 2011/0037175 A1 Feb. 17, 2011

(51) Int. Cl.
*H01L 23/48* (2006.01)
(52) U.S. Cl. ........... 257/773; 257/775; 257/E21.017; 438/618
(58) Field of Classification Search .............. None
See application file for complete search history.

(56) References Cited

U.S. PATENT DOCUMENTS

| 5,132,878 | A * | 7/1992 | Carey ........................... 361/778 |
| 6,027,995 | A * | 2/2000 | Chiang et al. ................. 438/623 |
| 6,194,667 | B1 | 2/2001 | Jimarez et al. |
| 6,645,842 | B2 | 11/2003 | Igarashi et al. |
| 7,429,177 | B2 * | 9/2008 | Li ................................. 439/77 |
| 2004/0184341 | A1 * | 9/2004 | Tsai ......................... 365/230.03 |
| 2006/0276019 | A1 | 12/2006 | Graf et al. |
| 2007/0038966 | A1 * | 2/2007 | Cerofolini et al. ................ 716/1 |
| 2008/0182402 | A1 | 7/2008 | Li et al. |
| 2008/0193658 | A1 * | 8/2008 | Millward ..................... 427/401 |
| 2009/0087664 | A1 | 4/2009 | Nealey et al. |

OTHER PUBLICATIONS

Patil et al., Automated Design of Misaligned-Carbon-Nanotube-Immune Circuits, DAC 2007, Jun. 4-8, 2007, San Diego, California. (http://www.stanford.edu/group/OTL/lagan/06364/DAC_final_v8.pdf).*
Patil et al., "Automated Design of Misaligned-Carbon-Nanotube-Immune Circuits" Department of Electrical Engineering and Computer Science, Stanford University Paper 2007, retrieved on Sep. 20, 2010 from <http://www.stanford.edu/group/OTL/lagan/06364/DAC_final_v8.pdf>.
International Search Report dated Sep. 30, 2010.

(Continued)

*Primary Examiner* — Benjamin Sandvik
*Assistant Examiner* — Scott R Wilson
(74) *Attorney, Agent, or Firm* — Scully, Scott, Murphy & Presser, P.C.; Louis J. Percello, Esq.

(57) ABSTRACT

An interconnection between a sublithographic-pitched structure and a lithographic pitched structure is formed. A plurality of conductive lines having a sublithographic pitch may be lithographically patterned and cut along a line at an angle less than 45 degrees from the lengthwise direction of the plurality of conductive lines. Alternately, a copolymer mixed with homopolymer may be placed into a recessed area and self-aligned to form a plurality of conductive lines having a sublithographic pitch in the constant width region and a lithographic dimension between adjacent lines at a trapezoidal region. Yet alternately, a first plurality of conductive lines with the sublithographic pitch and a second plurality of conductive lines with the lithographic pitch may be formed at the same level or at different.

26 Claims, 28 Drawing Sheets

OTHER PUBLICATIONS

U.S. Appl. No. 11/424,963, entitled "Sub-Lithographic Feature Patterning Using Self-Aligned Self-Assembly Polymers" filed on Jun. 19, 2006, First Named Inventor: Haining Yang.

Nealey, et al., "Self-Assembling Resists for Nanolithography" IEDM Technical Digest Digital Object Identifier 10.1109/IEDM (2005) 1609349.

Segalman, R.A., "Patterning with Block Copolymer Thin Films" Reports: A Review Journal Materials Science and Engineering R48 (2005) pp. 191-226.

Hawker, C.J. and Russeell, T.P., "Black Copolymer Lithography: Merging "Bottom-up" with "Top-Down" Procesesses" MRS Bulletin (2005) pp. 952-966, vol. 30.

Black, C.T. et al., "Polymer Self Assembly in Semiconductor Microelectronics" IBM Journal of Research and Development (2007) pp. 605-633, vol. 51(5).

Likharev, K. K., "Hybrid Semiconductor/Nanoelectronic Circuits: Freeing Advanced Lithography From the Alignment Accuracy Burden" Journal of Vacuum Science Technology American Vacuum Society (2007) pp. 2531-2536, vol. 25(6).

Cheng, J. et al., "Rapid Directed Self Assembly of Lamellar Microdomains From a Block Copolymer Containing Hybrid" Applied Physics Letters American Institute of Physics (2007) pp. 143106-1-143106-3, vol. 91.

* cited by examiner

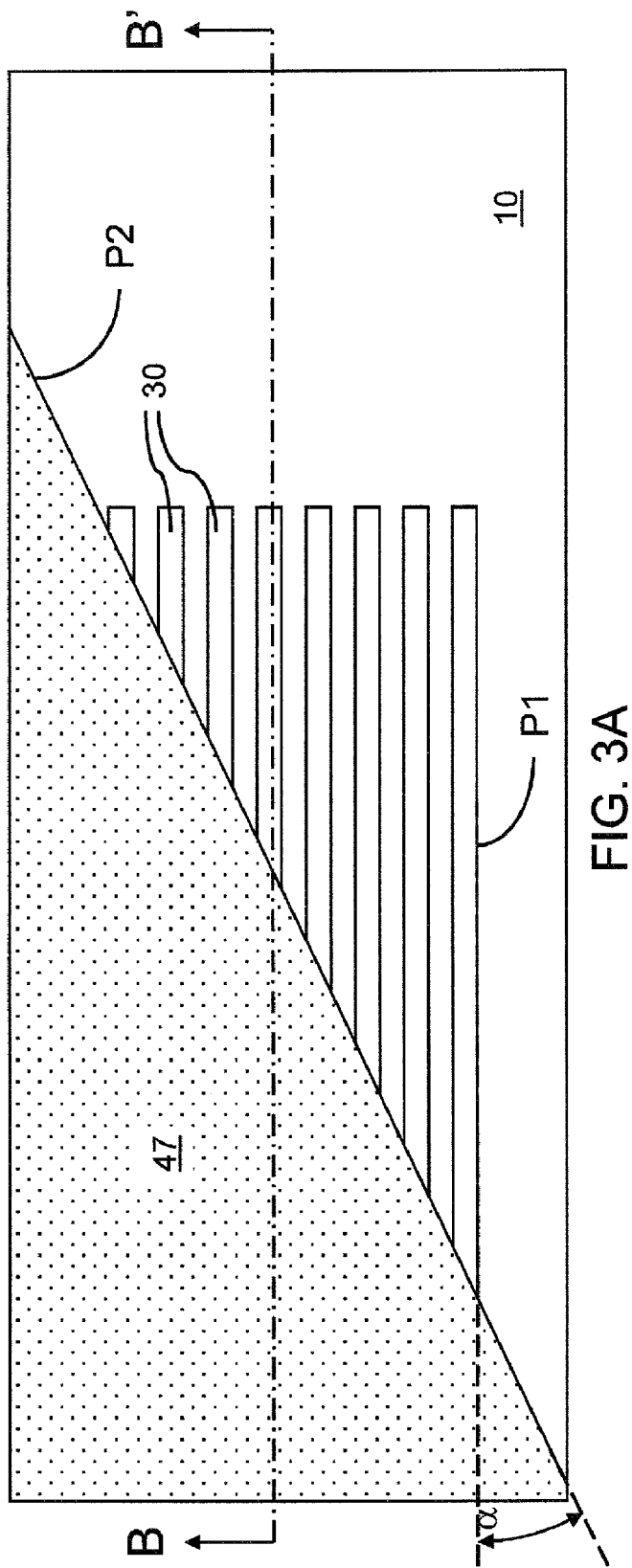
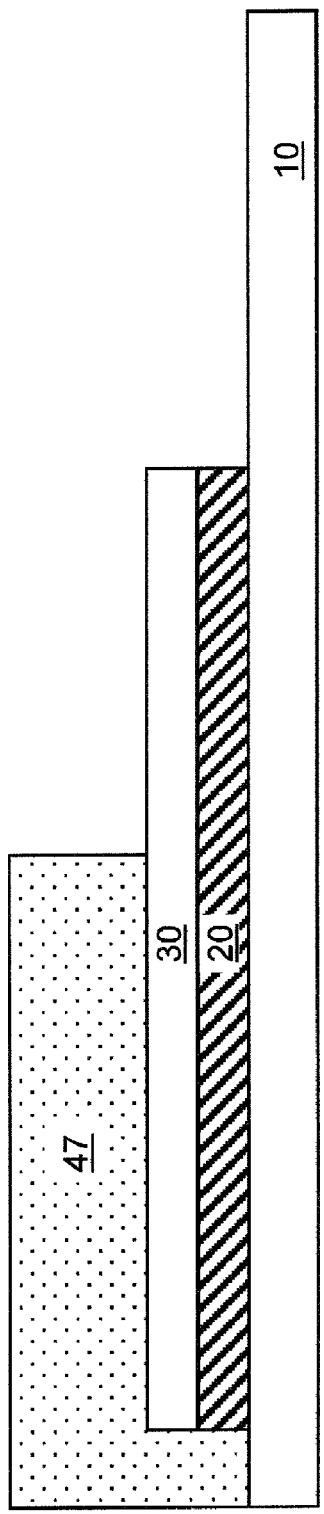
FIG. 3A
FIG. 3B

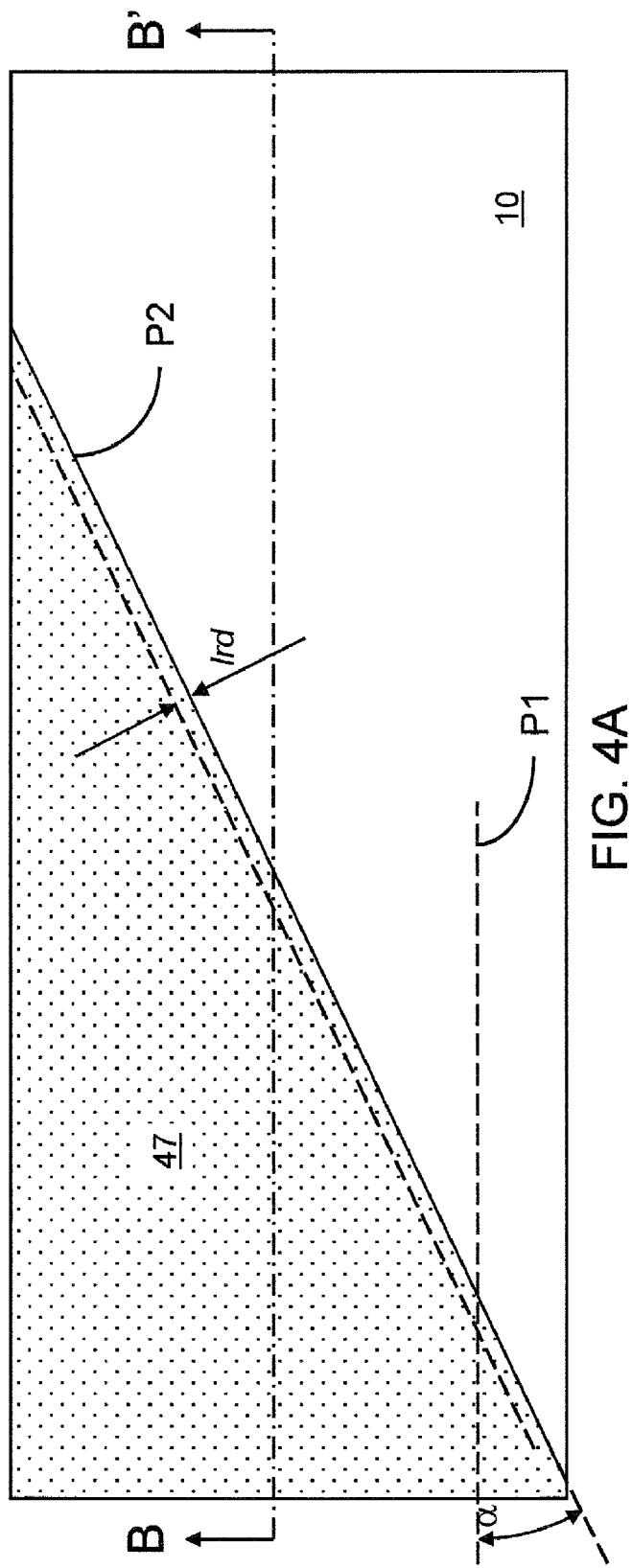
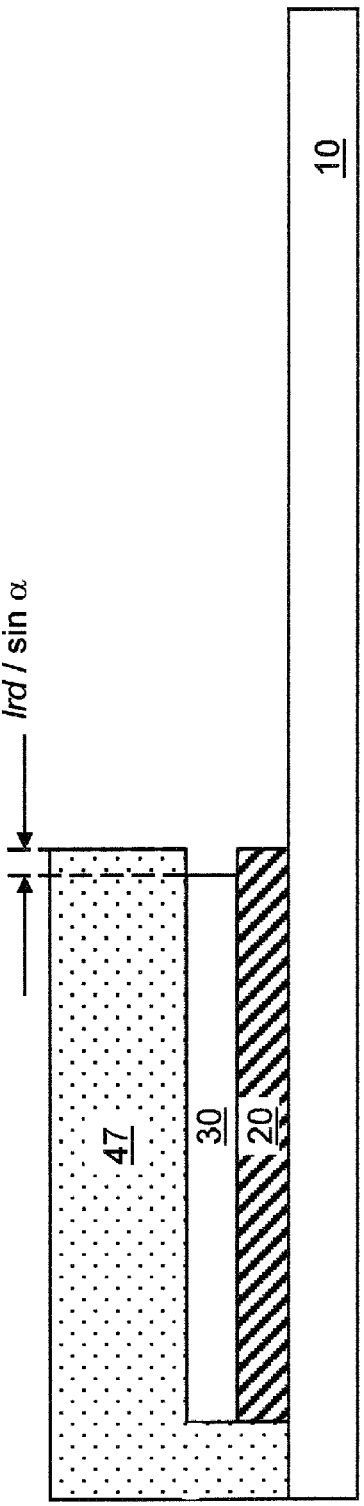
FIG. 4A
FIG. 4B

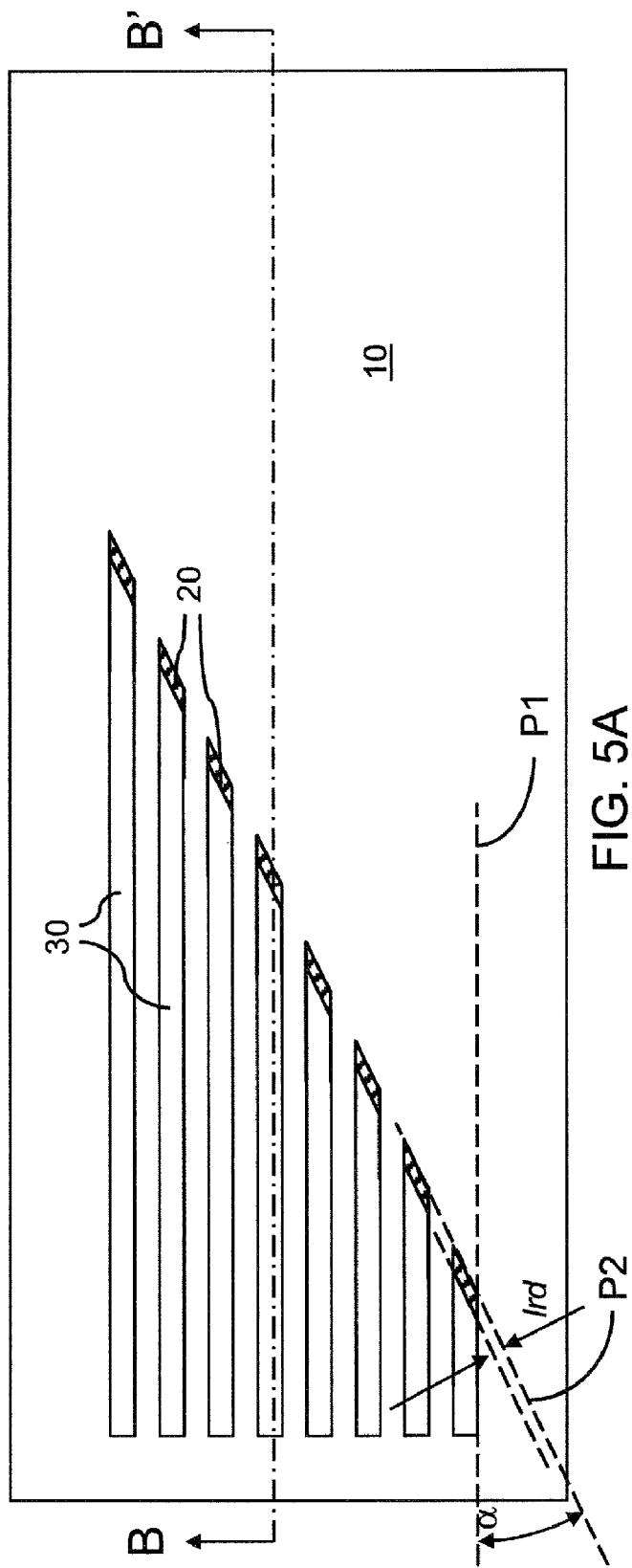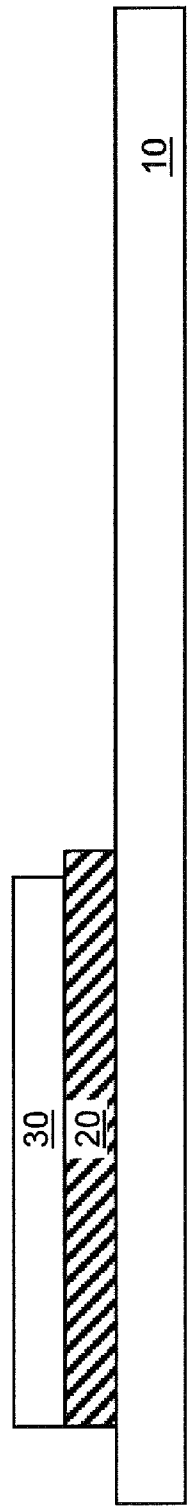
FIG. 5A
FIG. 5B

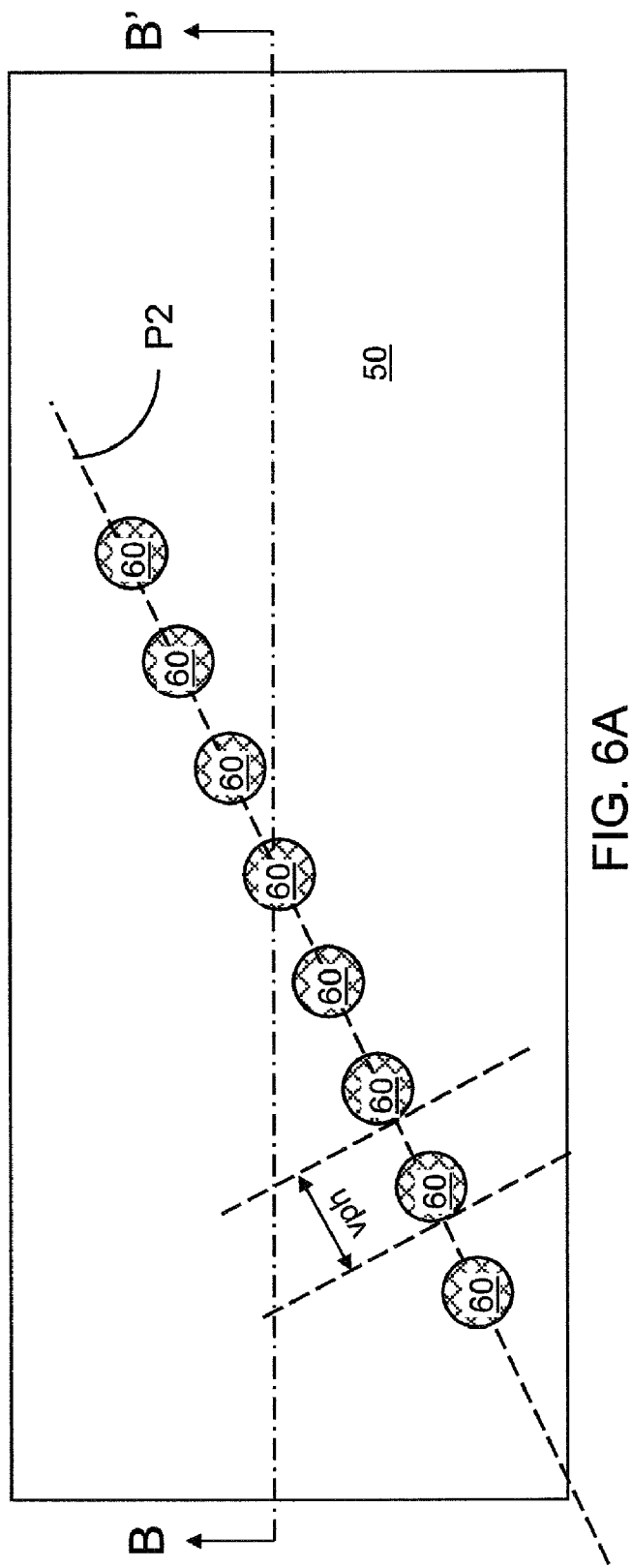
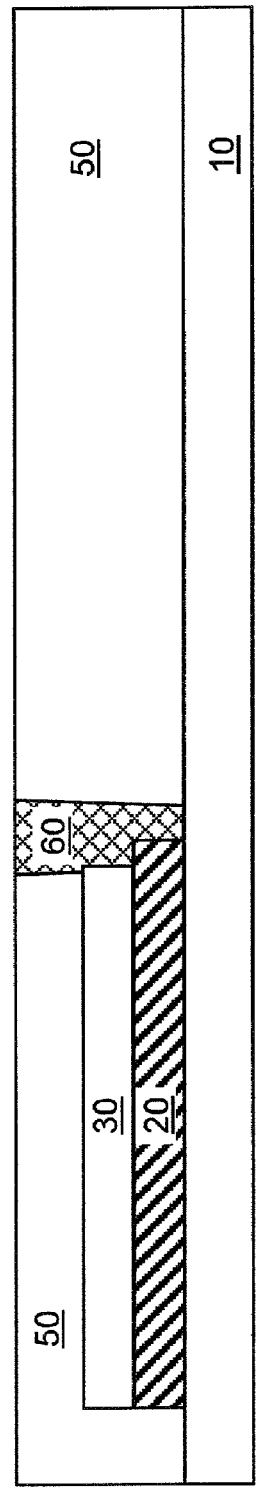

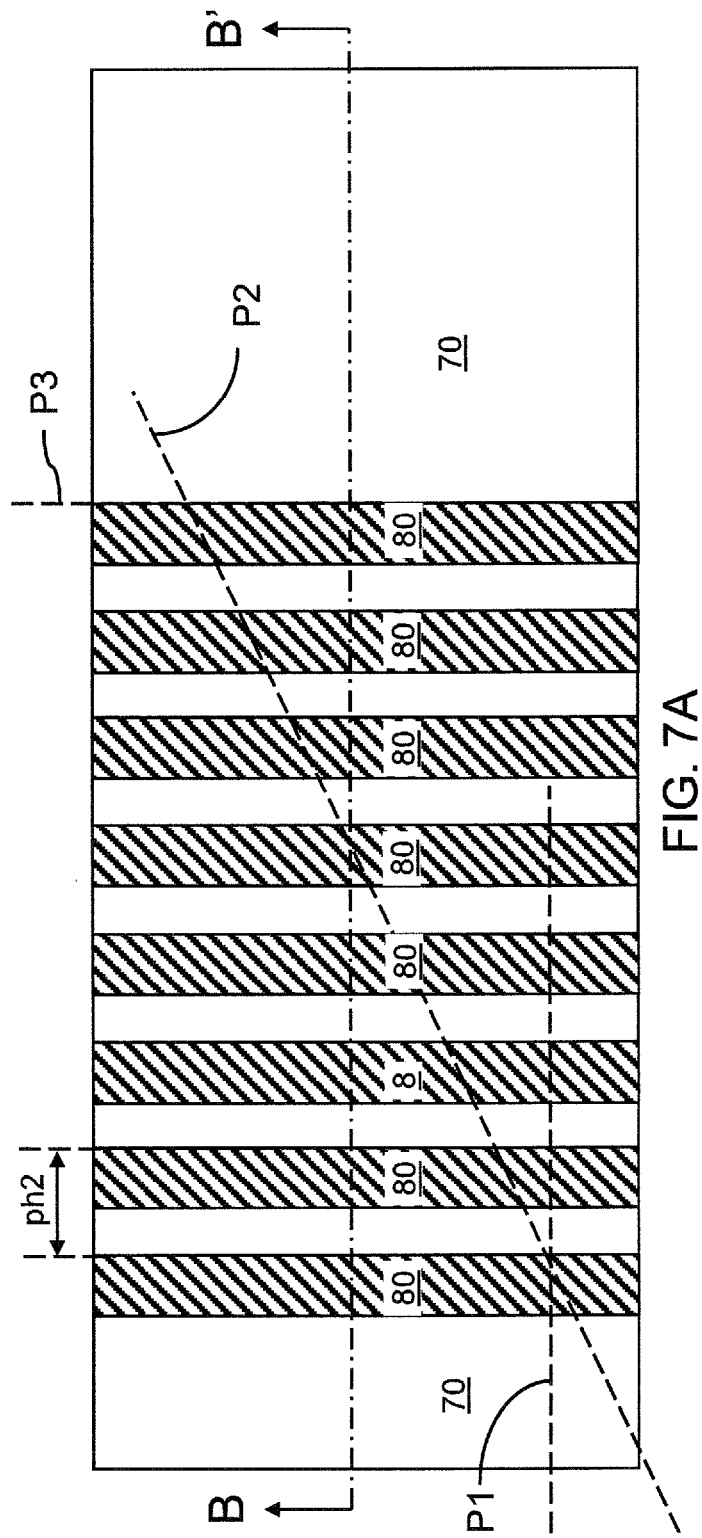
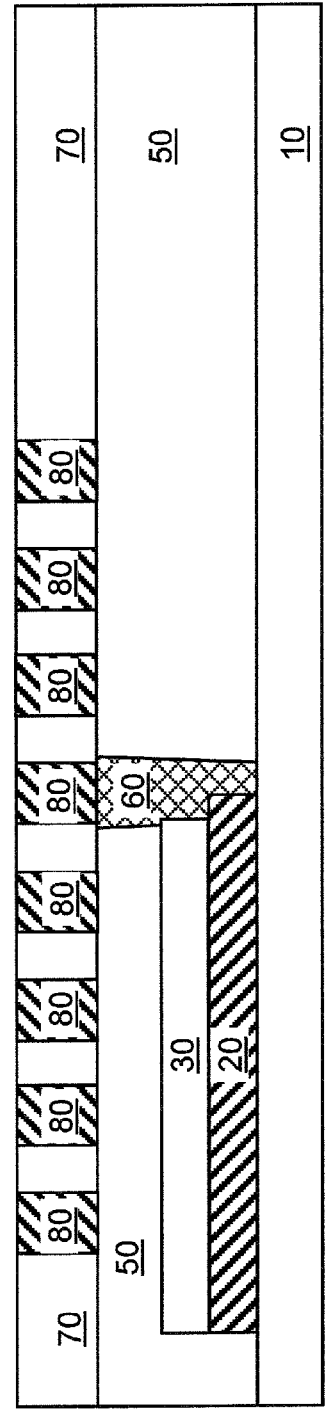
FIG. 7A
FIG. 7B

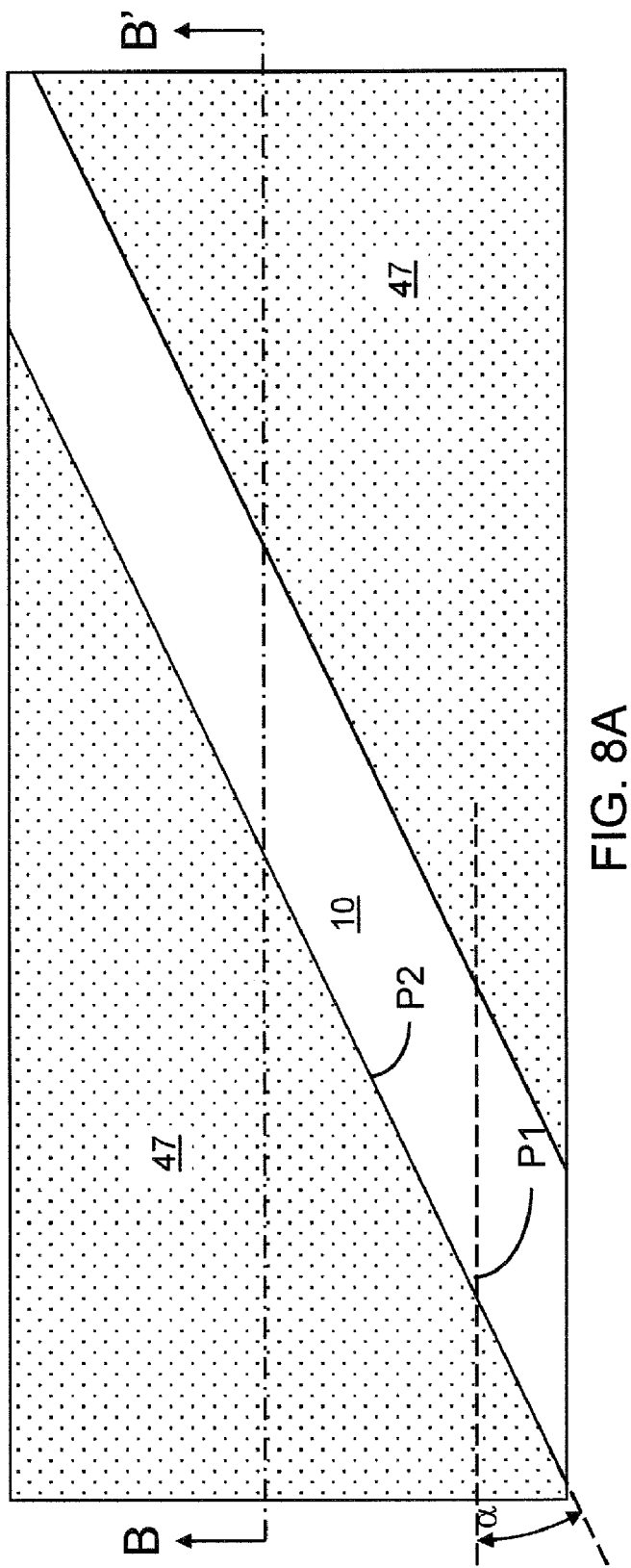
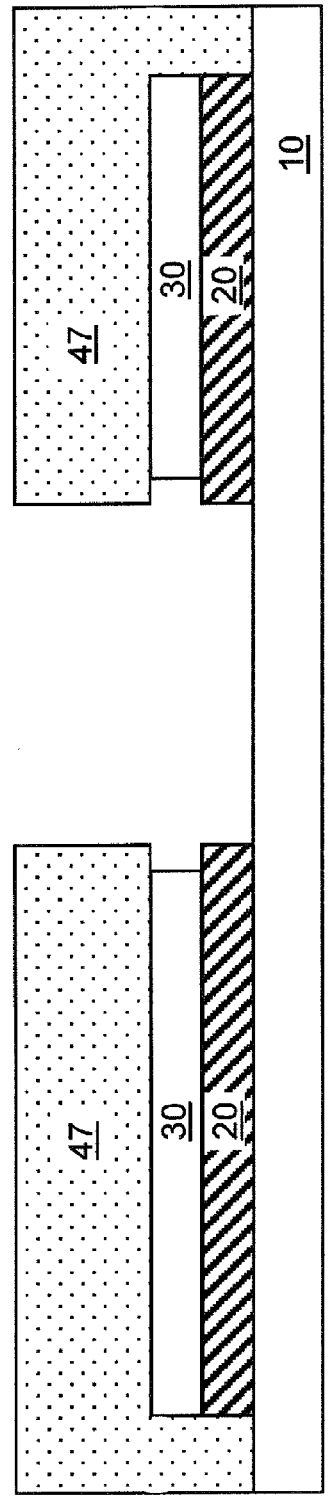
FIG. 8A
FIG. 8B

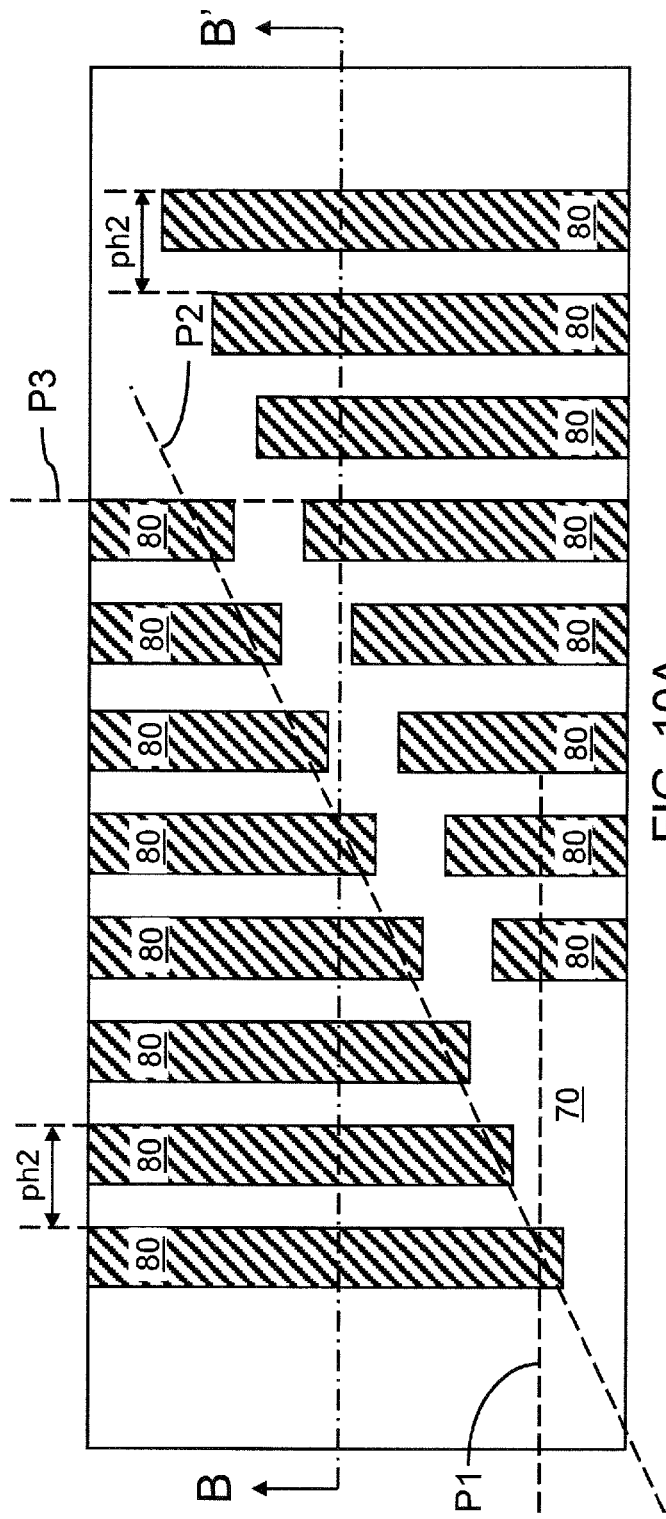
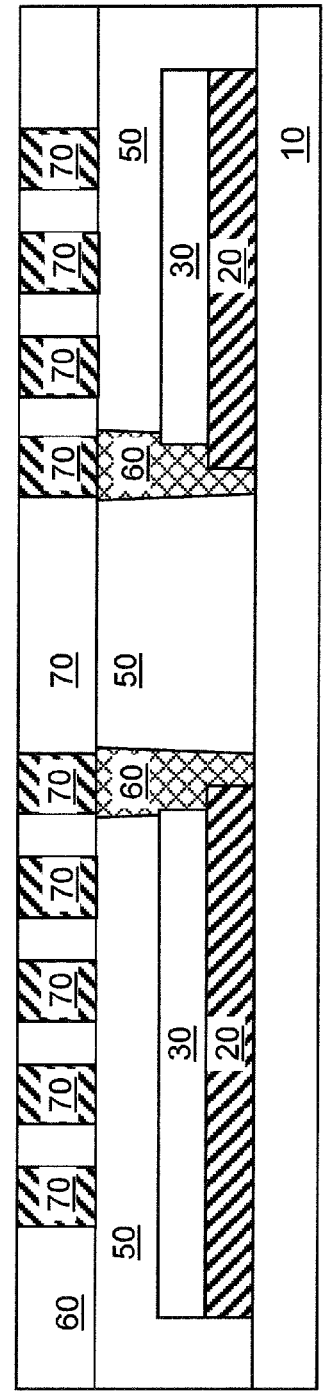
FIG. 10A
FIG. 10B

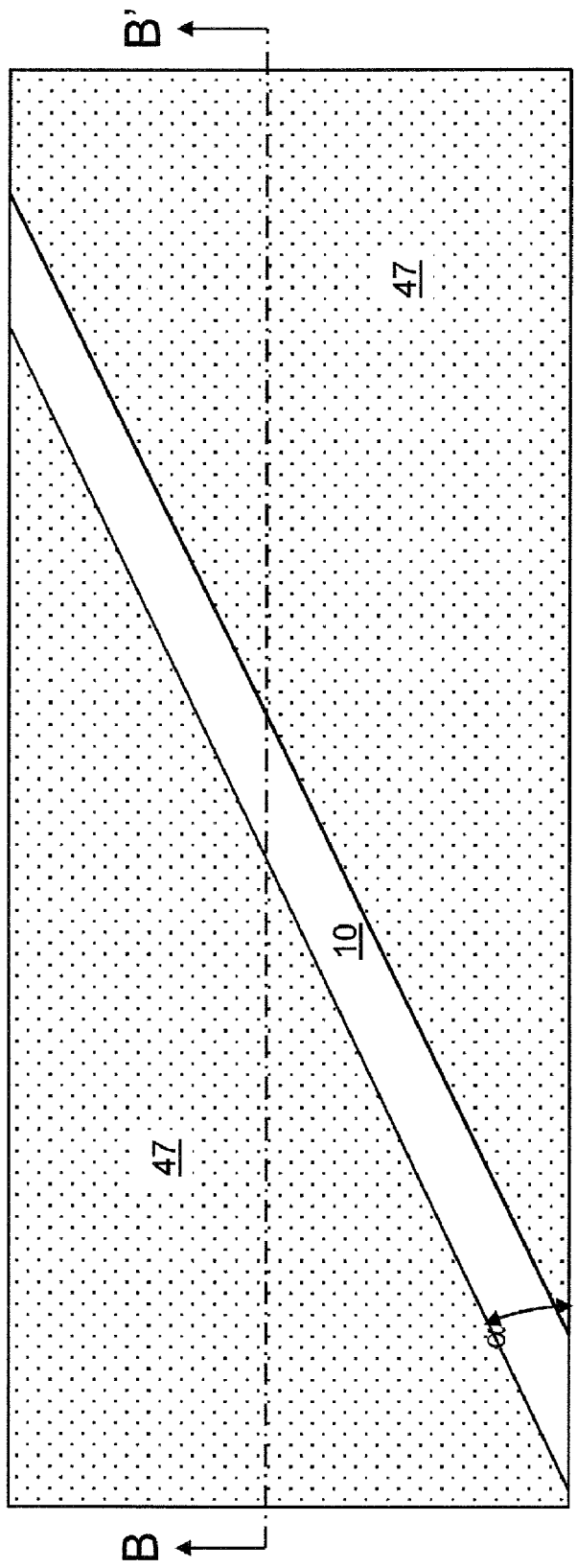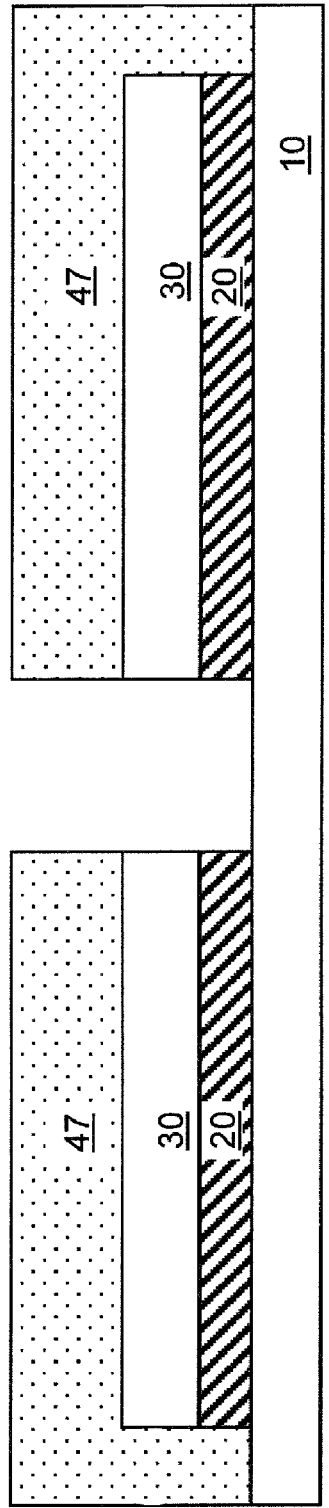

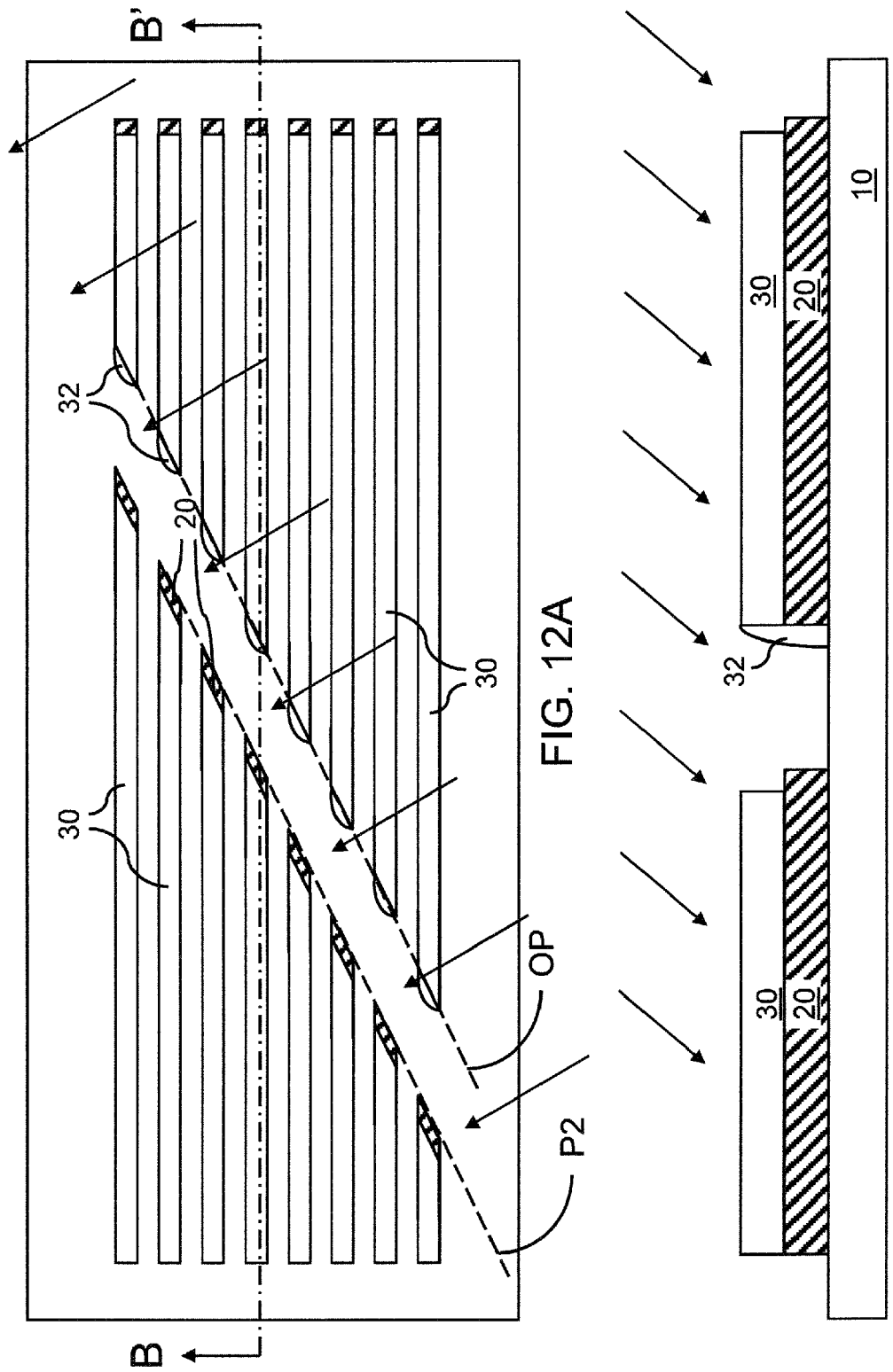

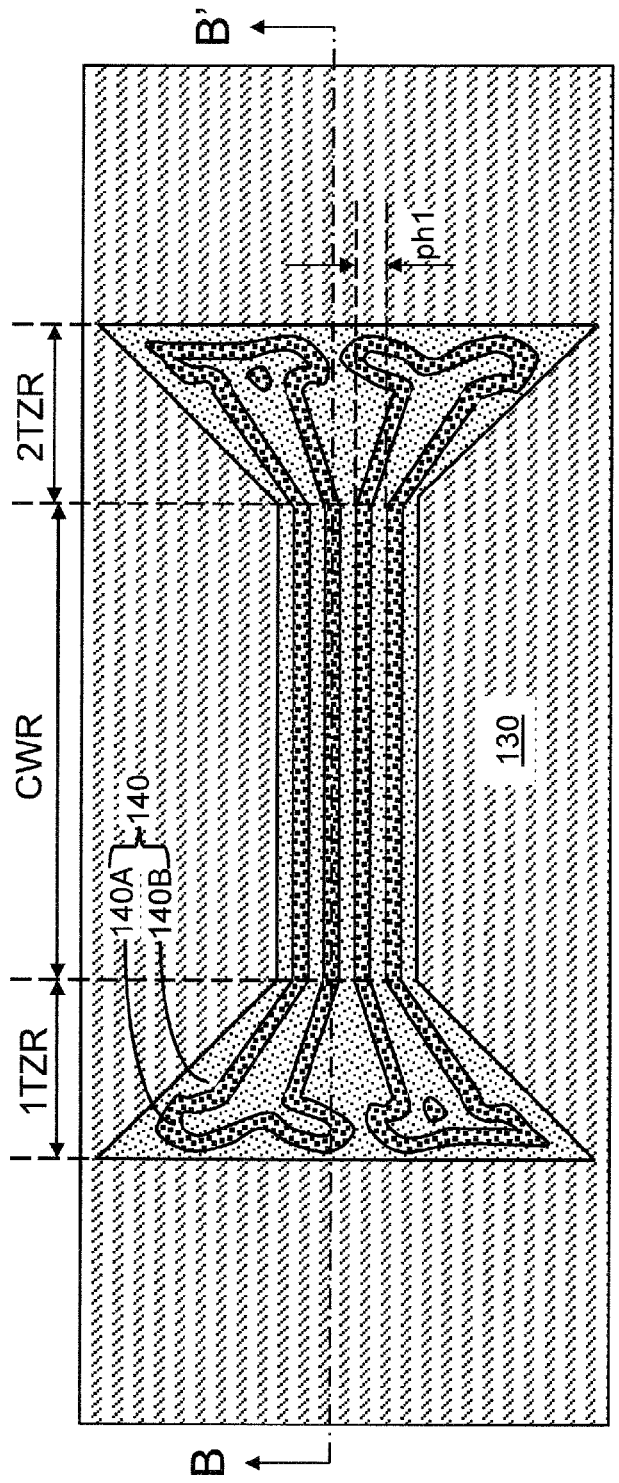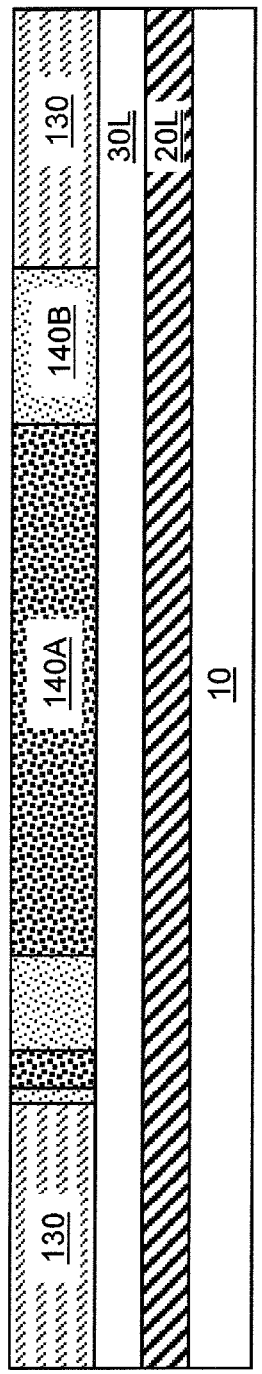
FIG. 15A
FIG. 15B

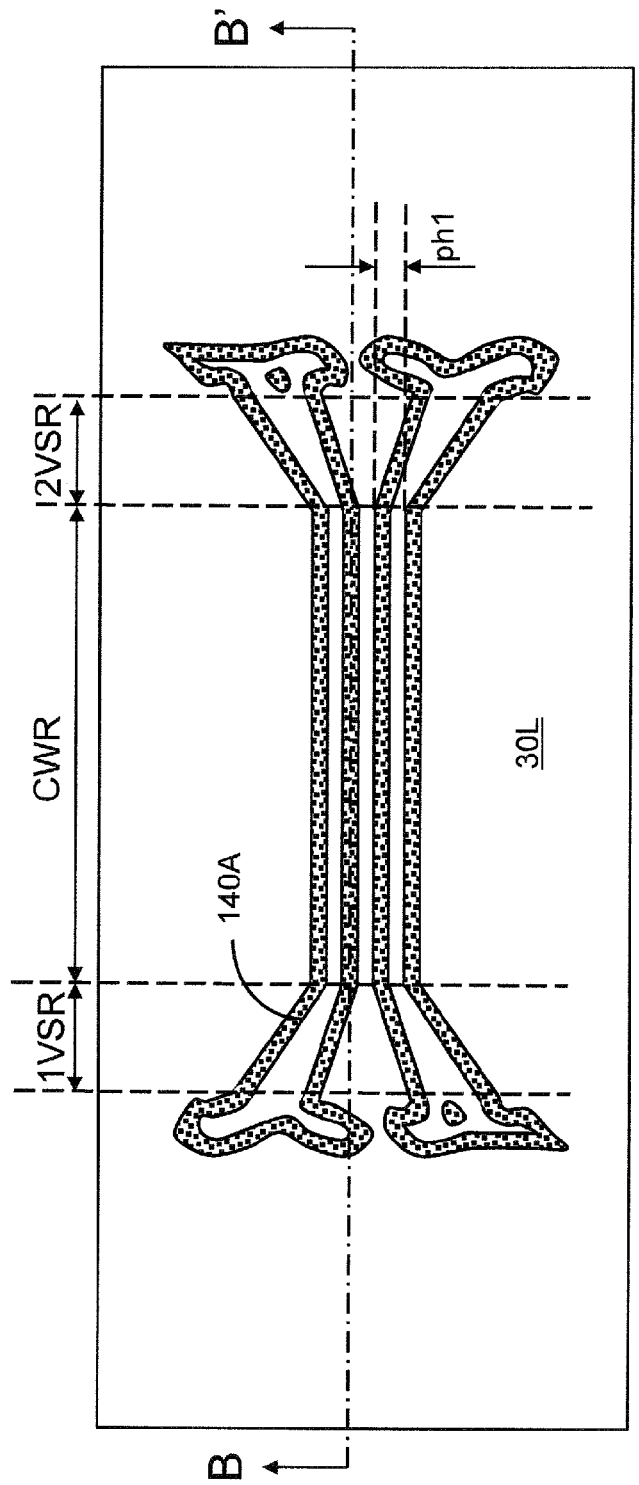
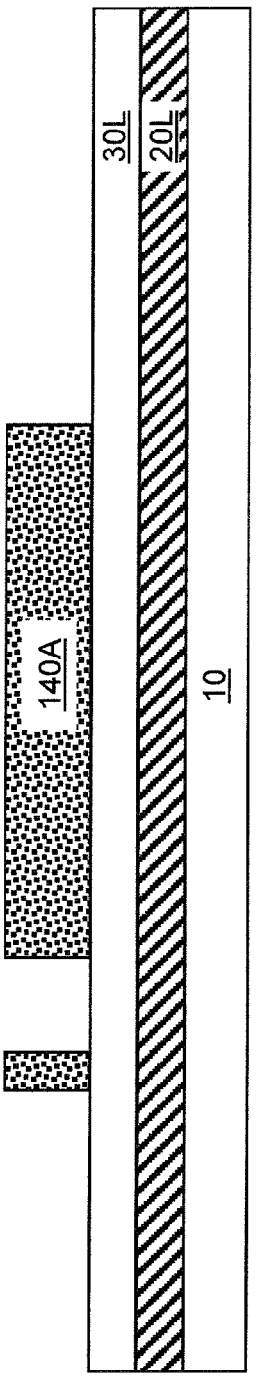
FIG. 16A
FIG. 16B

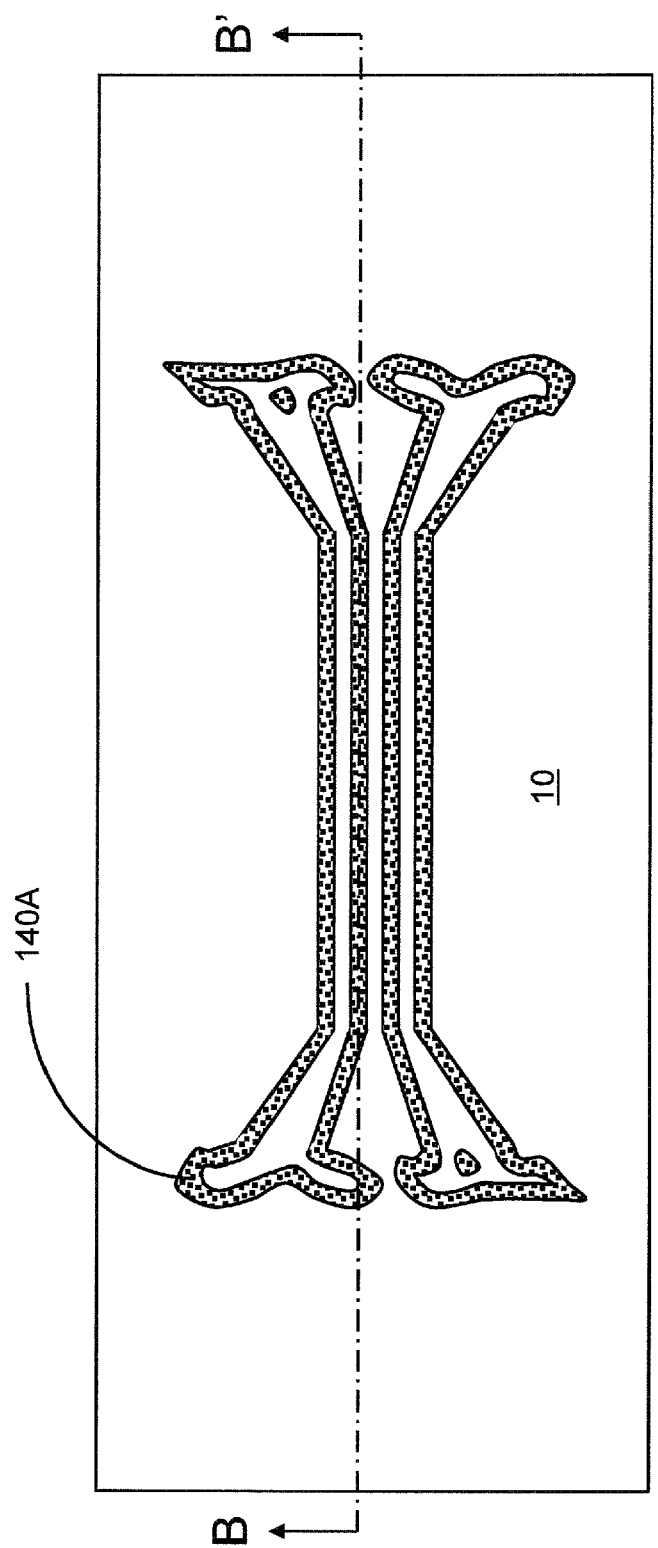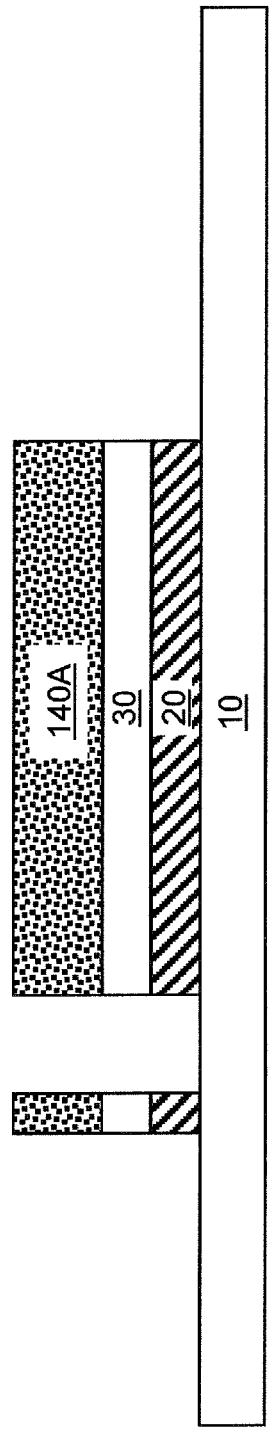
FIG. 17A
FIG. 17B

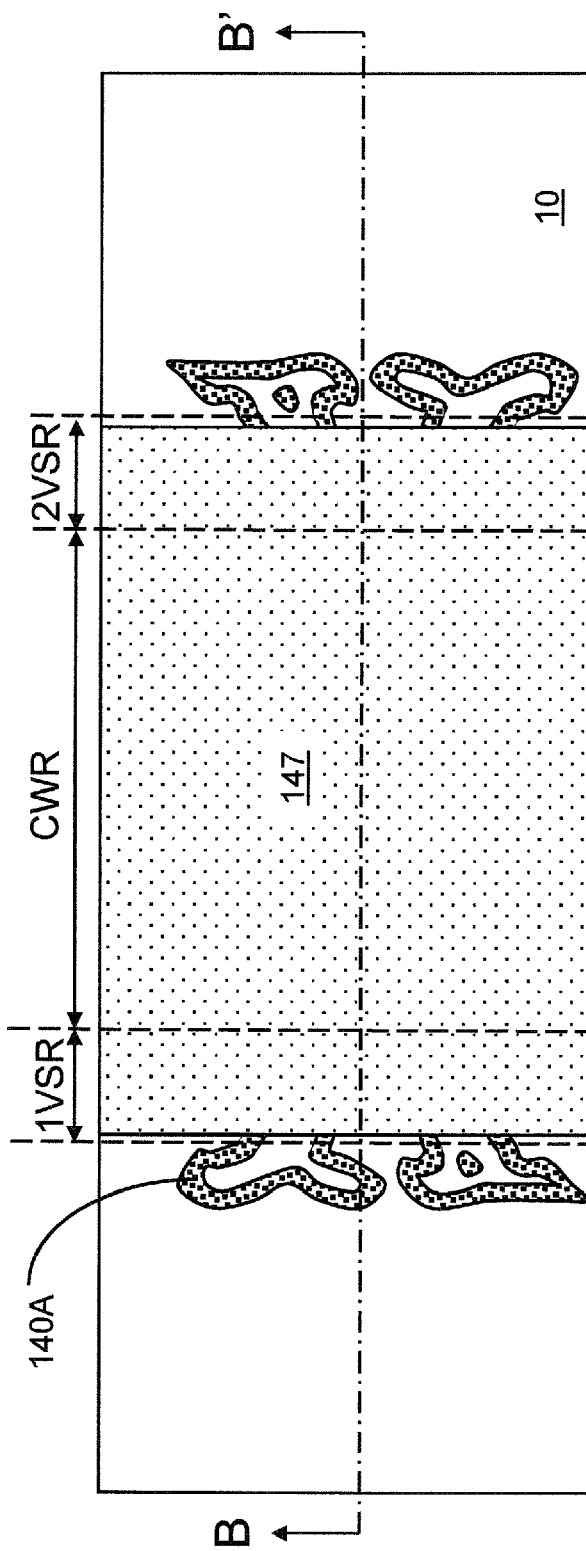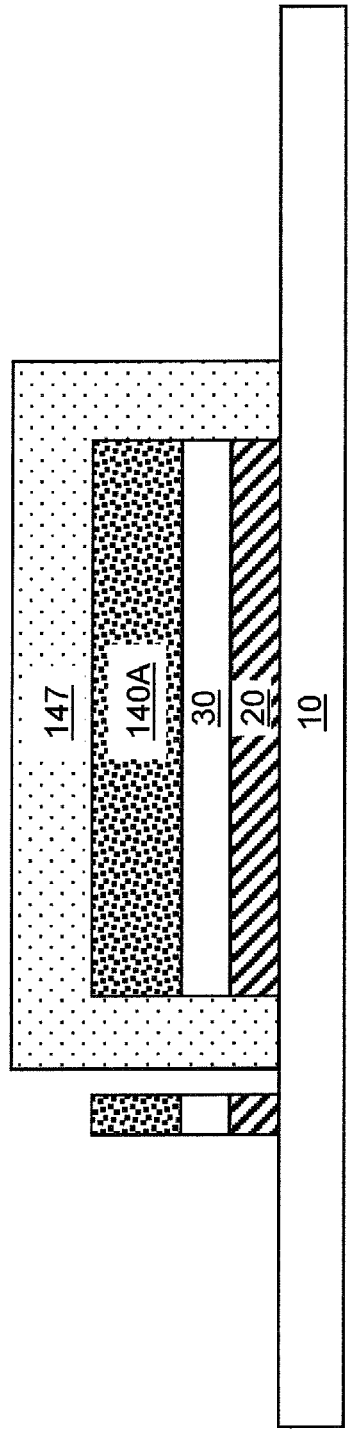
FIG. 18A
FIG. 18B

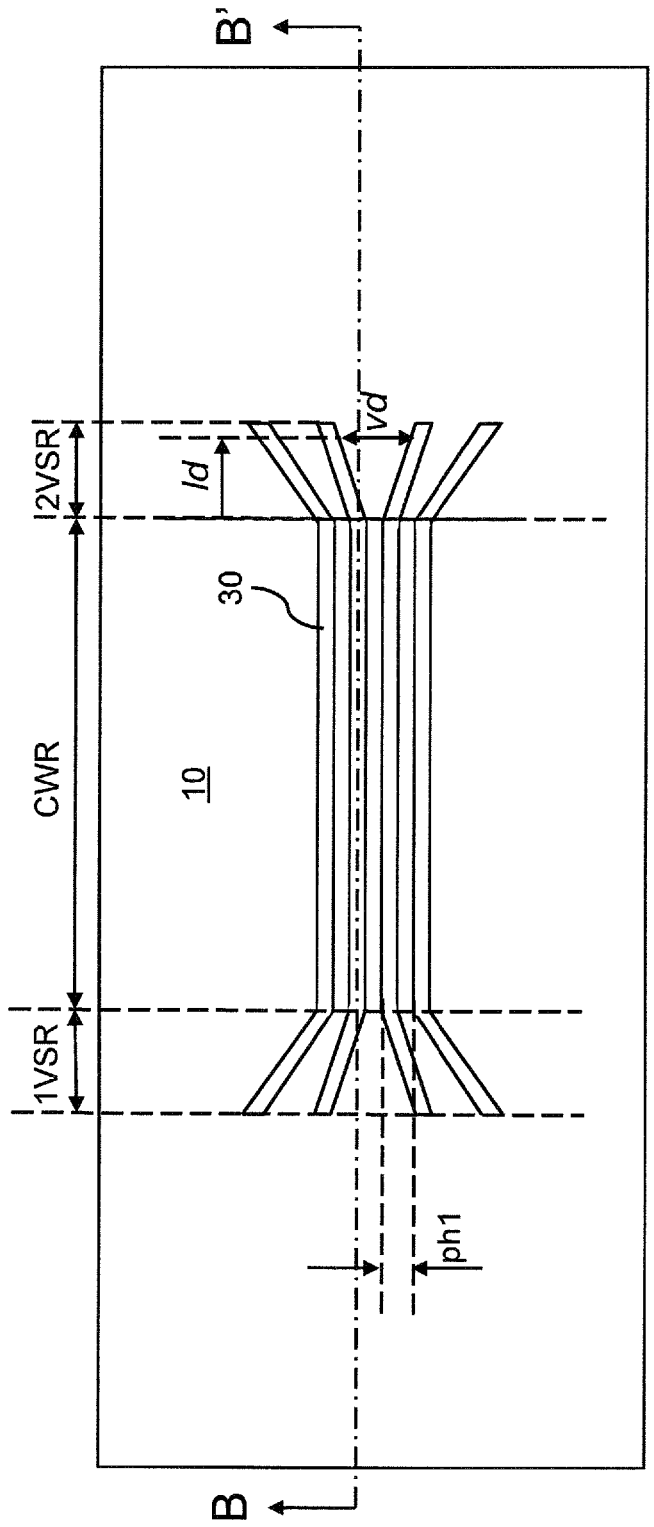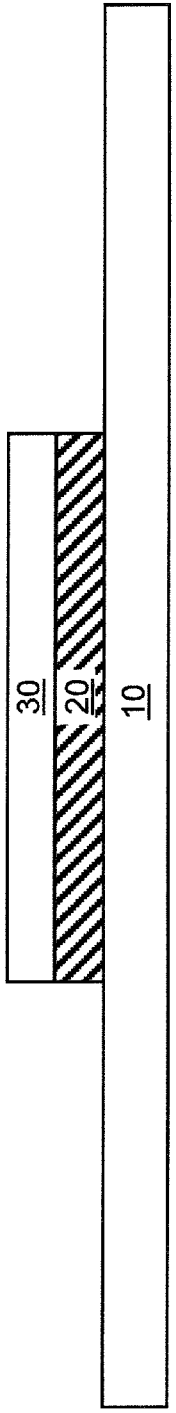
FIG. 19A
FIG. 19B

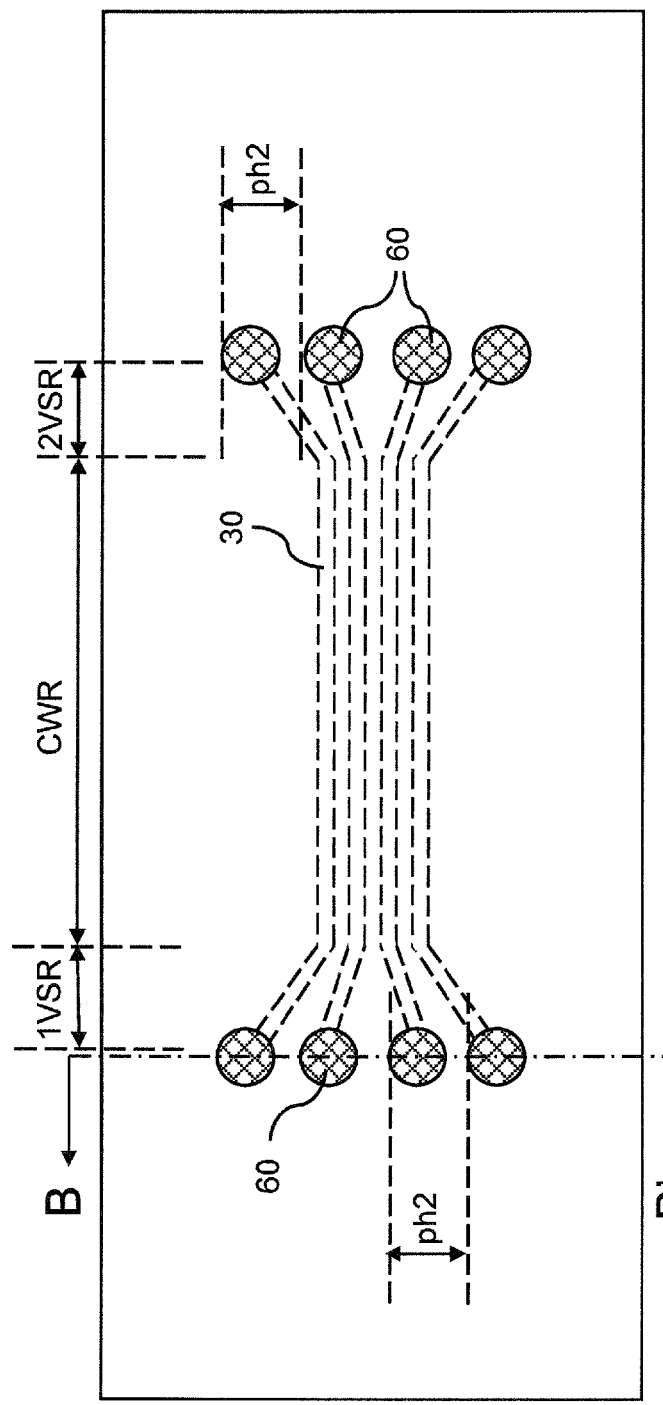
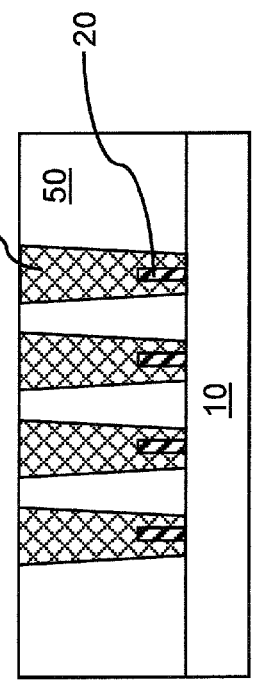
FIG. 20A
FIG. 20B

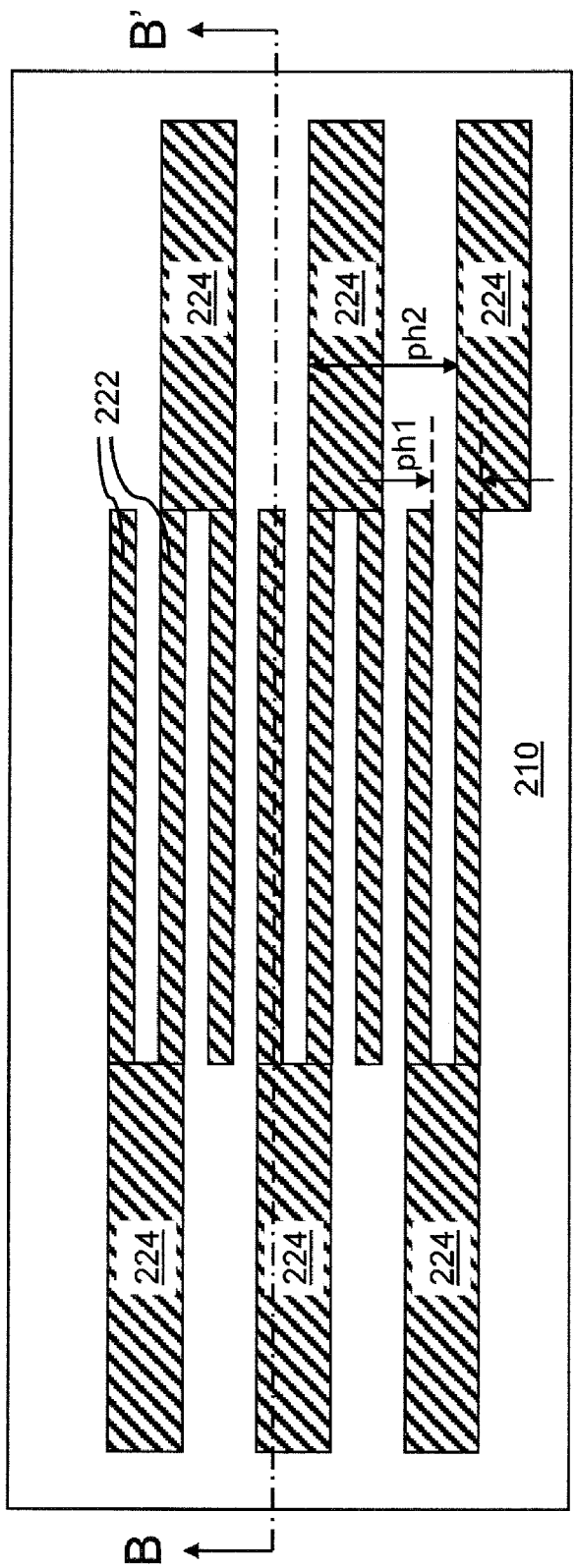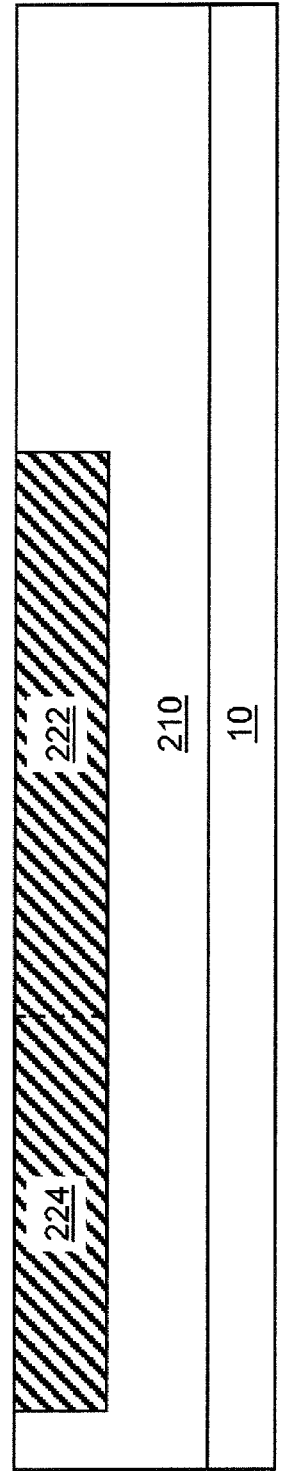
FIG. 24A
FIG. 24B

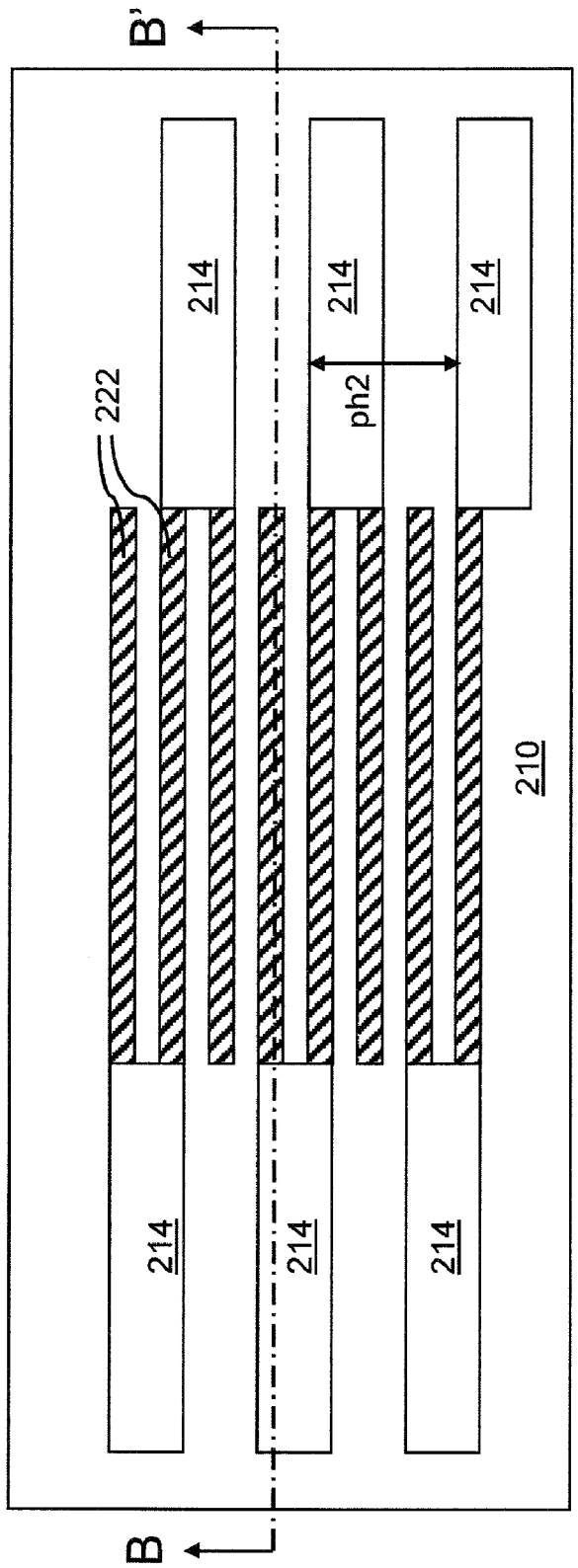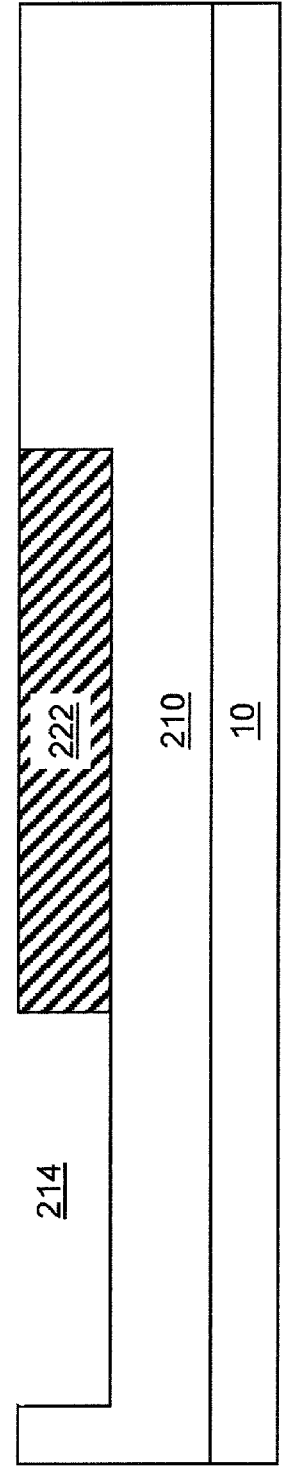
FIG. 26A
FIG. 26B

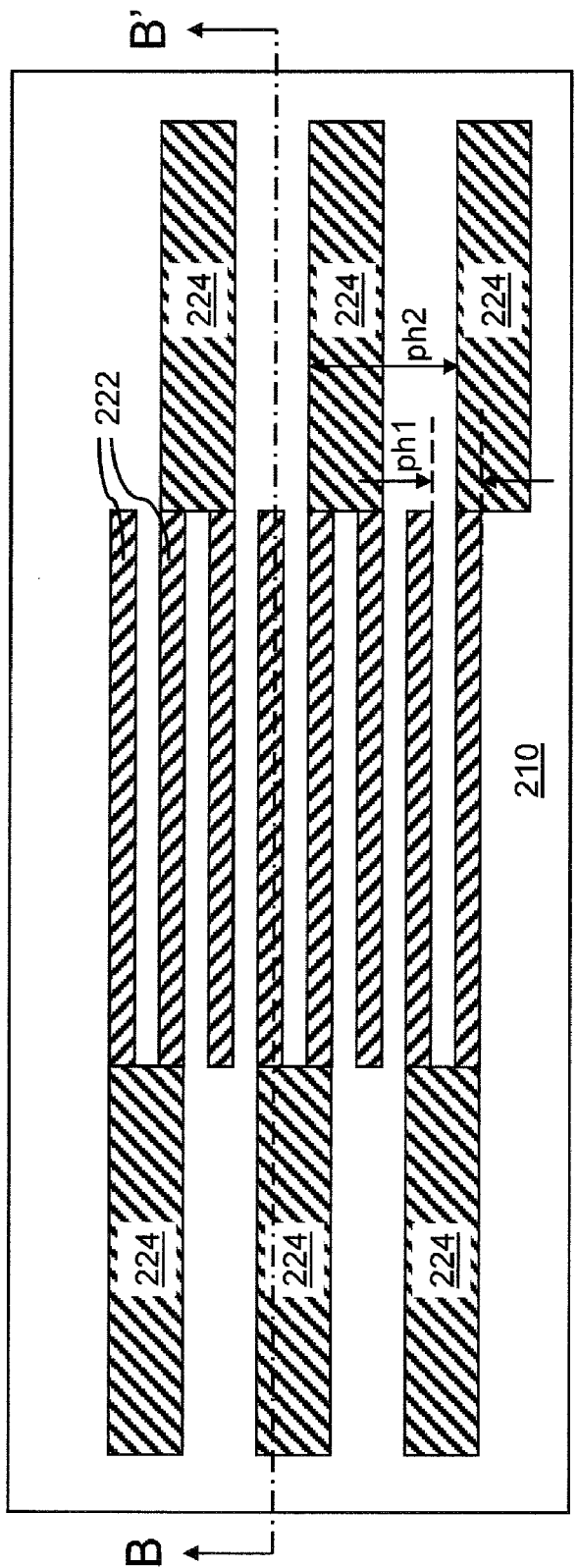
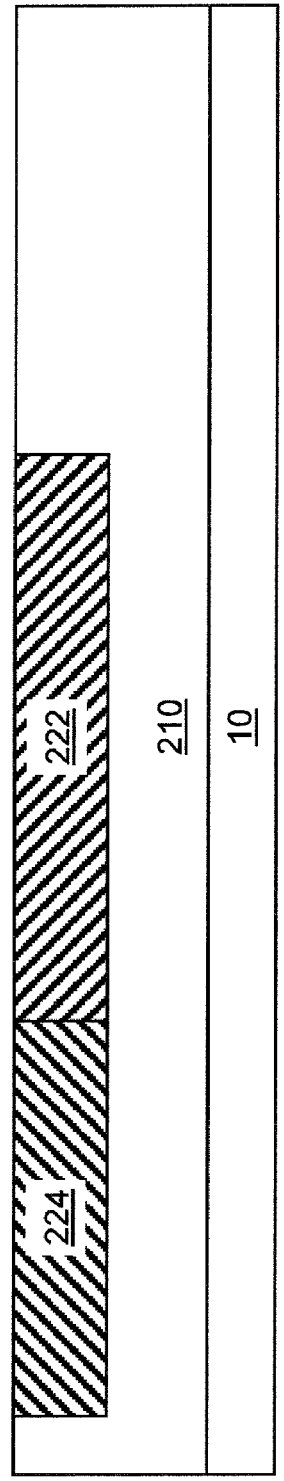
FIG. 27A
FIG. 27B

INTERCONNECTION BETWEEN SUBLITHOGRAPHIC-PITCHED STRUCTURES AND LITHOGRAPHIC-PITCHED STRUCTURES

BACKGROUND

The present invention relates to structures including an interconnection between a sublithographic-pitched structure and a lithographic-pitched structure and methods of manufacturing the same.

Self-assembling copolymers may be employed to form sublithographic-pitched structures, i.e., structures having a sublithographic pitch. The self-assembling block copolymers are first dissolved in a suitable solvent system to form a block copolymer solution, which is then applied onto the surface of the first exemplary structure to form a block copolymer layer. The solvent system used for dissolving the block copolymer and forming the block copolymer solution may comprise any suitable solvent, including, but not limited to toluene, propylene glycol monomethyl ether acetate (PGMEA), propylene glycol monomethyl ether (PGME), and acetone.

Dimensions of semiconductor structures are typically limited by a minimum printable dimension of a lithography tool employed to pattern the physical feature of the semiconductor structure. The minimum printable dimensions are referred to in the art as critical dimensions, which are defined as the width of narrowest parallel lines or narrowest parallel spaces having a minimum pintable pitch that may be formed employing available lithographic tools.

While a "lithographic minimum dimension" and a "sublithographic dimension" are defined only in relation to available lithography tools and normally changes from generation to generation of semiconductor technology, it is understood that the lithographic minimum dimension and the sublithographic dimension are to be defined in relation to the best performance of lithography tools available at the time of semiconductor manufacturing. As of the filing date of this application, the lithographic minimum dimension is about 35 nm and is expected to shrink in the future.

Incorporation of a sublithographic-pitched structure into a semiconductor structure requires electrical contacts between the sublithographic-pitched structure and lithographic-pitched structures. Structures for providing such electrical contacts are thus desired.

BRIEF SUMMARY

According to an embodiment of the present invention, a first structure is provided, which includes: a first plurality of conductive lines having a first pitch and embedded in at least one dielectric layer, wherein each of the first plurality of conductive lines has a pair of sidewalls that are parallel to a first vertical plane and an end wall located within a second vertical plane, wherein an angle between the first vertical plane and the second vertical plane is less than 45 degrees; and a plurality of conductive vias, wherein each of the plurality of conductive vias contacts an end portion of one of the plurality of conductive lines and is embedded in the at least one dielectric layer, and wherein the second vertical plane intersects each of the plurality of conductive vias.

According to another aspect of the present invention, a second structure is provided, which includes: a first plurality of conductive lines embedded in at least one dielectric layer and having a constant width region and at least one varying spacing region that adjoins the constant width region, wherein the first plurality of conductive lines has a constant first pitch within the constant width region and a varying distance between a neighboring pair of the first plurality of conductive lines within the at least one varying spacing region, wherein the varying distance increases with a lateral distance from an end portion of the constant width region; and a plurality of conductive vias having a second pitch, wherein each of the plurality of conductive vias contacts an end portion of one of the plurality of conductive lines and is embedded in the at least one dielectric layer, wherein the second pitch is greater than the first pitch.

According to even another aspect of the present invention, a third structure is provided, which includes: a first plurality of conductive lines having a first pitch and embedded in at least one dielectric layer; and a second plurality of conductive lines embedded in the at least one dielectric layer and having a second pitch, wherein the second pitch is greater than the first pitch and at least one of the second plurality of conductive lines is resistively connected to at least two of the first plurality of conductive lines.

According to yet another aspect of the present invention, a method of forming a structure is provided, which includes: forming a first plurality of conductive lines having a first pitch on a substrate, wherein each of the first plurality of conductive lines has a pair of sidewalls that are parallel to a first vertical plane; patterning the first plurality of conductive lines employing a photoresist having a sidewall along a second vertical plane, wherein an end wall of each of the patterned first plurality of conductive lines is formed within the second vertical plane, and wherein an angle between the first vertical plane and the second vertical plane is less than 45 degrees; forming a dielectric layer over the patterned first plurality of conductive lines; and forming a plurality of conductive vias in the dielectric layer, wherein each of the plurality of conductive vias contacts an end portion of one of the plurality of conductive lines and the second vertical plane intersects each of the plurality of conductive vias.

According to still another aspect of the present invention, another method of forming a structure is provided, which includes: forming a first plurality of conductive lines having a constant width region and at least one varying spacing region that adjoins the constant width region, wherein the first plurality of conductive lines has a constant first pitch within the constant width region and a varying distance between a neighboring pair of the first plurality of conductive lines within the at least one varying spacing region, wherein the varying distance increases with a lateral distance from an end portion of the constant width region; forming a dielectric layer on the plurality of conductive lines; and forming a plurality of conductive vias having a second pitch within the dielectric layer, wherein each of the plurality of conductive vias contacts an end portion of one of the plurality of conductive lines, wherein the second pitch is greater than the first pitch.

According to a further aspect of the present invention, yet another method of forming a structure is provided, which includes: forming a first plurality of conductive lines having a first pitch in at least one dielectric layer; and forming a second plurality of conductive lines having a second pitch in the at least one dielectric layer, wherein the second pitch is greater than the first pitch and at least one of the second plurality of conductive lines is resistively connected to at least two of the first plurality of conductive lines.

BRIEF DESCRIPTION OF THE SEVERAL VIEWS OF THE DRAWINGS

Throughout the drawings, figures with the same numeric label correspond to the same stage of manufacturing; figures with the suffix "A" are top-down views; figures with the suffix "B" are vertical cross-sectional views along the plane B-B' of the corresponding figure with the same numeric label and the suffix "A."

FIGS. 1A-7B are sequential views of a first exemplary structure according to a first embodiment of the present invention.

FIGS. 8A-10B are sequential views of a first variation on the first exemplary structure according to the first embodiment of the present invention.

FIGS. 11A-13B are sequential views of a second variation on the first exemplary structure according to the first embodiment of the present invention.

FIGS. 14A-21B are sequential views of a second exemplary structure according to a second embodiment of the present invention.

FIGS. 22A-24B are sequential views of a third exemplary structure according to a third embodiment of the present invention.

FIGS. 25A-27B are sequential views of a first variation on the third exemplary structure according to the third embodiment of the present invention.

DETAILED DESCRIPTION

Figure 1A:
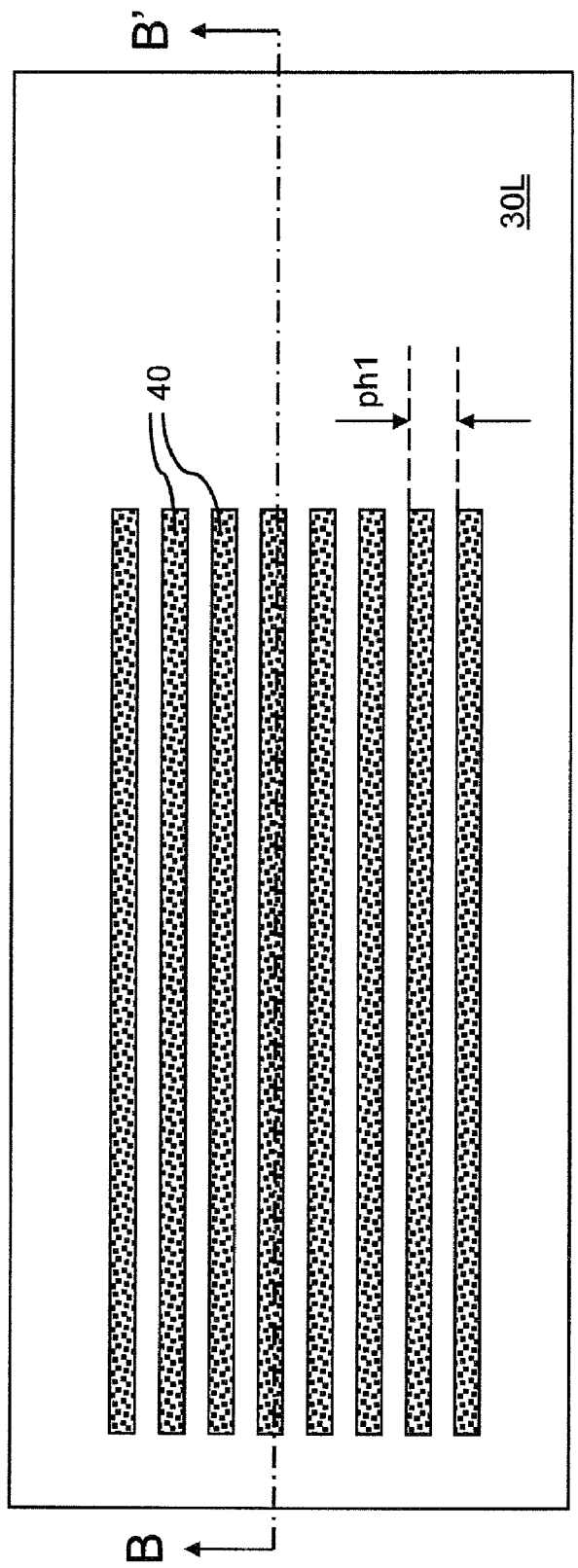

As stated above, the present invention relates to structures including an interconnection between a sublithographic-pitched structure and a lithographic-pitched structure and methods of manufacturing the same, which are now described in detail with accompanying figures. Like and corresponding elements having the same composition are referred to by like reference numerals.

Figure 1B:
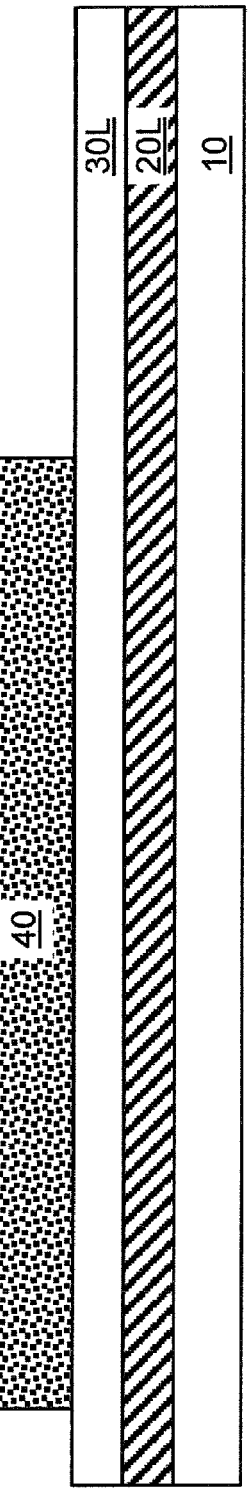

Referring to FIGS. 1A and 1B, a first exemplary structure according to a first embodiment of the present invention includes a substrate 10, a conductive material layer 20L formed on a top surface thereof, a dielectric material layer 30L, and a plurality of polymer block lines 40 having a first pitch ph1. The substrate 10 may be any type of material including, but not limited to, a semiconductor substrate, an insulator substrate, a conductor substrate, or a combination thereof. For example, the substrate 10 may be a semiconductor substrate including at least one semiconductor device such as a field effect transistor. The substrate 10 may also include one or more dielectric layers embedding at least one metal interconnect structure resistively connected to the conductive material layer 20L.

The conductive material layer 20L includes a conductive material such as an elemental metal, a metal alloy, a conductive metallic compound, and electrically doped semiconductor material. For example, the conductive material layer 20L may include W, Cu, Al, TaN, TiN, WN, a metal silicide, a metal germanide, a doped crystalline semiconductor material, a doped polycrystalline semiconductor material, or a combination thereof. The thickness of the conductive material layer 20L may be from 5 nm to 200 nm, although lesser and greater thicknesses can also be employed.

The dielectric material layer 30L includes a dielectric material such as silicon oxide, silicon nitride, silicon oxynitride, carbon-doped oxide, organic polymer insulator, a dielectric metal oxide such as $HfO_2$, $Al_2O_3$, or a combination thereof. The thickness of the dielectric material layer 30L may be from 5 nm to 200 nm, although lesser and greater thicknesses can also be employed.

The plurality of polymer block lines 40 having a first pitch phi is formed by methods known in the art. Specifically, the plurality of polymer block lines 40 having the first pitch ph1 is formed by employing a self-assembling copolymer layer. A pattern in the plurality of polymer block lines is transferred into the conductive material layer 20L on the substrate 10. The remaining portions of the conductive material layer 20L after the transfer of the pattern constitutes a first plurality of conductive lines.

For example, a template layer (not shown) is deposited on the top surface of the dielectric material layer 30L. The template layer is patterned to include a recessed area within which the top surface of the dielectric material layer 30L is exposed. The recessed area of the template layer has two parallel edges in the lengthwise direction. A block copolymer layer (not shown) including self-assembling block copolymers are applied into the recessed area. The block copolymer layer including two or more immiscible polymeric block components is capable of self-organizing into nanometer-scale patterns. Under suitable conditions, the two or more immiscible polymeric block components separate into two or more different phases on a nanometer scale and thereby form ordered patterns of isolated nano-sized structural units. Such ordered patterns of isolated nano-sized structural units formed by the self-assembling block copolymers can be used for fabricating nano-scale structural units in semiconductor, optical, and magnetic devices. Specifically, dimensions of the structural units so formed are typically in the range of 5 to 30 nm, which are sub-lithographic (i.e., below the resolutions of the lithographic tools).

Exemplary block copolymer materials are described in commonly-assigned, copending U.S. patent application Ser. Nos. 11/424,963, filed on Jun. 19, 2006, the contents of which are incorporated herein by reference. Specific examples of self-assembling block copolymers that can be used for forming the structural units of the present invention may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

The block copolymer layer is annealed at an elevated temperature to form the plurality of polymer block lines 40 containing a first polymeric block component and a matrix (not shown) containing a second polymeric block component. The matrix is the complement of the plurality of polymer block lines 40 within the structure formed by the anneal of the block copolymer layer. Exemplary processes of annealing the self-assembling block copolymers in the block copolymer layer to form two sets of polymer blocks are described in Nealey et al., "Self-assembling resists for nanolithography," IEDM Technical Digest, December 2005, Digital Object Identifier 10.1109/IEDM.2005.1609349, the contents of which are incorporated herein by reference. The anneal may be performed, for example, at a temperature from 100° C. to 300° C. for a duration from 1 hour to 100 hours. The matrix containing the second polymeric block component is removed selective to the plurality of polymer block lines 40 to form the structure of FIG. 1. The selective removal process may be a chemical developer or solvent, or by a selective reactive ion etch (RIE) process, or a combination of both.

The first pitch ph1 may be a sublithographic pitch, i.e., a pitch that is less than the critical pitch for a periodic array of parallel line patterns. The critical pitch is the smallest pitch that may be printed employing available lithographic tools at any given time, and as of the filing date of the instant application, the critical pitch is about 70 nm, although this dimension is expected to shrink as performance of available lithography tools improve. Preferably, the first pitch ph1 is from 8 nm to 60 nm, and more preferably, from 16 nm to 40 nm, although lesser and greater dimensions for the first pitch ph1 can also be employed.

Figure 2A:
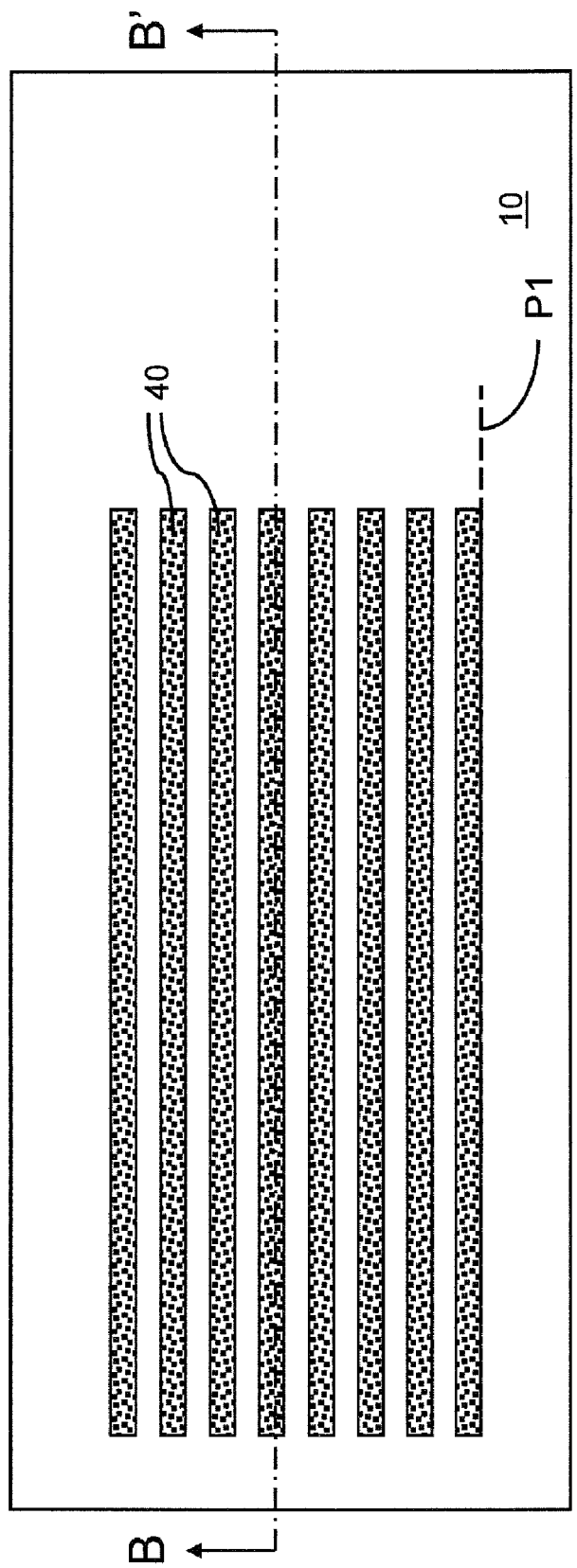
Figure 2B:
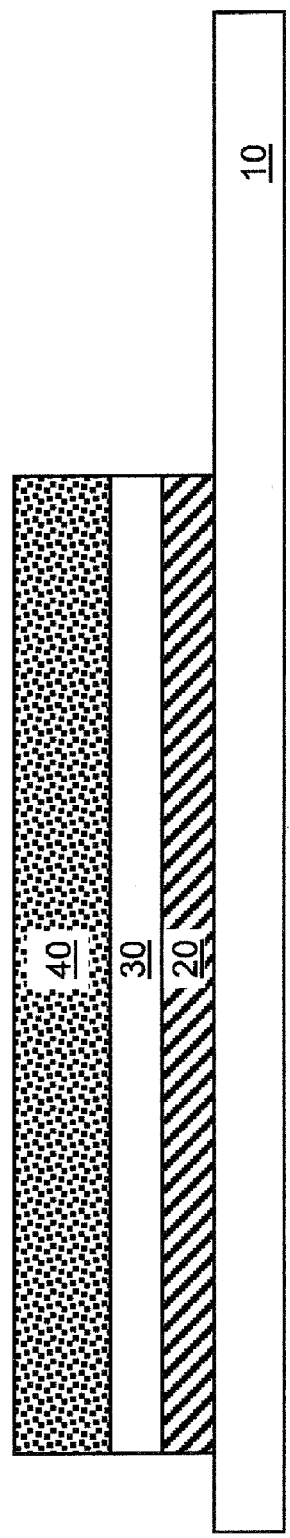

Referring to FIGS. 2A and 2B, the sublithographic pattern, i.e., a pattern with at least one sublithographic dimension, in the plurality of polymer block lines 40 is transferred into the stack of the dielectric material layer 30L and the conductive material layer 20L, for example, by an anisotropic ion etch employing the plurality of polymer block lines 40 as an etch mask. The remaining portions of the dielectric material layer 30L constitutes a plurality of dielectric material portions 30. The remaining portions of the conductive material layer 20L constitute a first plurality of conductive lines 20 having the first pitch ph1. The sidewalls of the first plurality of conductive lines 20, the plurality of dielectric material portions 30, and the plurality of polymer block lines 40 are vertically coincident, i.e., lie in the same vertical planes.

Each of the first plurality of conductive lines 20 has a pair of sidewalls that are parallel to a first vertical plane P1, which is in the plane of one of the sidewalls of the first plurality of conductive lines 20. Each pair of sidewalls of the first plurality of conductive lines 20 is oriented along a lengthwise direction of the first plurality of conductive lines 20. The lengthwise direction is the direction having a greater dimension from one end to the other, and is perpendicular to a widthwise direction which is the direction along the first pitch ph1. The plurality of dielectric material portions 30 has the first pitch ph1. The first plurality of conductive lines 20 also has the first pitch ph1. The plurality of polymer block lines 40 is removed selective to the first plurality of conductive lines 20, the plurality of dielectric material portions 30, and the substrate 10.

Referring to FIGS. 3A and 3B, a photoresist layer 47 is applied to the top surface of the substrate 10 and the exposed surfaces of the first plurality of conductive lines 20 and the plurality of dielectric material portions 30. The photoresist layer 47 is lithographically patterned to form a vertical sidewall that overlies the top surfaces of the plurality of dielectric material portions 30. The stacks of the plurality of dielectric material portions 30 and the first plurality of conductive lines 20 and the substrate 10 are exposed in the area not covered by the photoresist layer 47. Preferably, the vertical sidewall of the photoresist layer 47 is in a vertical plane, which is herein referred to a second vertical plane P2. The angle α between the first vertical plane P1 and the second vertical plane P2 is less than 45 degrees, and is preferably less than 30 degrees, and more preferably from 5 degrees to 20 degrees.

Referring to FIGS. 4A and 4B, exposed portions of the stacks of the plurality of dielectric material portions 30 and the first plurality of conductive lines 20 are removed by an anisotropic etch, such as a reactive ion etching, employing the photoresist layer 47 as an etch mask. The end walls of the plurality of dielectric material portions 30 and the first plurality of conductive lines 20 are vertically coincident with the second vertical plane P2 immediately after the anisotropic etch, and are at the angle α relative to the sidewalls of the plurality of dielectric material portions 30 and the first plurality of conductive lines 20, which are parallel to the first vertical plane P1.

Preferably, the end walls of the plurality of dielectric material portions 30 are laterally recessed by a constant distance, which is herein referred to as a lateral recess distance lrd, relative to the sidewalls of the photoresist layer 47 and the end walls of the first plurality of conductive lines 20 that are within the second vertical plane P2. Each sidewall of the plurality of dielectric material portions 30 coincides with a plane of a sidewall of first plurality of conductive lines 20, and each end wall of the plurality of dielectric material portions 30 is offset from the second vertical plane P2 by a constant distance, i.e., the lateral recess distance lrd. Preferably, the lateral recess distance lrd is a sublithographic dimension, and may be from 2 nm to 20 nm, although lesser and greater dimensions can also be employed.

Referring to FIGS. 5A and 5B, the photoresist layer 47 is removed selective to the plurality of dielectric material portions 30, the first plurality of conductive lines 20, and the substrate 10. One end wall of each of the plurality of dielectric material portions 30 is vertically coincident with an end wall of the underlying conductive line 20, while the other end wall of each of the plurality of dielectric material portions 30 is laterally offset from the other end wall of the underlying conductive line 20 by the lateral recess distance lrd to expose a portion of the top surface of the underlying conductive line 20.

Referring to FIGS. 6A and 6B, a first dielectric layer 50 is formed over the plurality of dielectric material portions 30, the first plurality of conductive lines 20, and the substrate 10, and is planarized, for example, by chemical mechanical planarization (CMP) or by self-planarization. The first dielectric layer 50 includes a dielectric material such as silicon oxide, doped silicate glasses, silicon nitride, silicon oxynitride, self-planarizing low dielectric constant (low-k) material having a dielectric constant less than 2.7, organosilicate glasses having a dielectric constant less than 2.7, porous dielectric materials, or a combination thereof.

A plurality of via holes is formed along the second vertical plane P2 such that each via hole exposes only one conductive line 20. Specifically, a plurality of via holes is formed in the first dielectric layer 50 along the second vertical plane P2 by lithographically patterning the first dielectric layer 50. Sidewalls of the plurality of dielectric material portions 30 and top surfaces of the first plurality of conductive lines 20 are exposed within the plurality of via holes. A conductive material is filled within the plurality of via holes to form a plurality of conductive vias 60. Each of the plurality of conductive vias 60 contacts an end portion of one of the plurality of conductive lines 20 and is embedded in the first dielectric layer 50. The second vertical plane P2 intersects each of the plurality of conductive vias 60. The plurality of conductive vias 60 has a via pitch vph, which is a lithographic pitch, i.e., a pitch that is equal to or greater than a minimum pitch that may be formed by lithographic methods. For example, the lithographic pitch may be equal to, or greater than, 70 nm. Preferably, the plane that connects the center axes of each of the plurality of conductive vias 60 coincides with the second vertical plane P2, or is parallel to the second vertical plane P2. Each of the plurality of conductive vias 60 contacts a top surface and an end wall of one of the first plurality of conductive lines 20.

Referring to FIGS. 7A and 7B, a second dielectric layer 70 is formed over the first dielectric layer 50. The second dielectric layer 70 includes a dielectric material, which may be selected from any of the material that may be employed as the first dielectric layer 50. A plurality of line trenches having a lithographic pitch is formed in the second dielectric layer 70. The lithographic pitch of the plurality of trenches is herein referred to as a second pitch ph2.

A second plurality of conductive lines 80 is formed within the plurality of line trenches by deposition of a conductive material and planarization. The second plurality of conductive lines 80 may include any of the material that may be employed as the first plurality of conductive lines 20. The second plurality of conductive lines 80 has the second pitch ph2, which is a lithographic pitch.

The lengthwise direction, i.e., the horizontal direction within the plane including the sidewalls, of the second plurality of conductive lines 80 may be parallel to a third vertical plane P3, which is a plane of one of the sidewalls of the second plurality of conductive lines 80. Each of the second plurality of conductive lines 80 has a pair of sidewalls that are perpendicular to the first vertical plane P1 and parallel to the third vertical plane P3. In this case, the third vertical plane P3 is orthogonal to the first vertical plane P1. In this case, the direction of the second pitch ph2 is parallel to the direction of the first vertical plane P1. A bottom surface of each of the second plurality of conductive lines 80 abuts one of the plurality of conductive vias 60.

Alternatively, the first dielectric layer 50 and the second dielectric layer 70 may be formed in the same deposition step as a single dielectric layer, and the plurality of conductive vias 60 and the second plurality of conductive lines 80 may be formed integrally by the same deposition and planarization process.

Referring to FIGS. 8A and 8B, a first variation on the first exemplary structure is derived from the first exemplary structure of FIGS. 2A and 2B by applying a photoresist layer 47 and lithographically patterning the photoresist layer 47 to include a pair of parallel vertical sidewalls that are at an angle α from the first plane P1. The pair of parallel vertical sidewalls are separated by a lithographic dimension, i.e., at a distance greater than 35 nm, and typically, at a distance greater than 100 nm. One of the vertical sidewalls of the photoresist layer 47 is a second vertical plane P2. The angle α between the first vertical plane PI and the second vertical plane P2 is less than 45 degrees, and is preferably less than 30 degrees, and more preferably from 5 degrees to 20 degrees.

Exposed portions of the stacks of the plurality of dielectric material portions 30 and the first plurality of conductive lines 20 are removed by an anisotropic etch, such as a reactive ion etching, employing the photoresist layer 47 as an etch mask. The end walls of the plurality of dielectric material portions 30 and the first plurality of conductive lines 20 are vertically coincident with the vertical sidewalls of the photoresist layer 47 immediately after the anisotropic etch, and are at the angle α relative to the first vertical plane P1, which is parallel to the sidewalls of the plurality of dielectric material portions 30 and the first plurality of conductive lines 20. Preferably, the end walls of the plurality of dielectric material portions 30 are laterally recessed by a constant distance in the same manner as described above. Subsequently, the photoresist layer 47 is removed selective to the plurality of dielectric material portions 30, the first plurality of conductive lines 20, and the substrate 10.

Figure 9A:
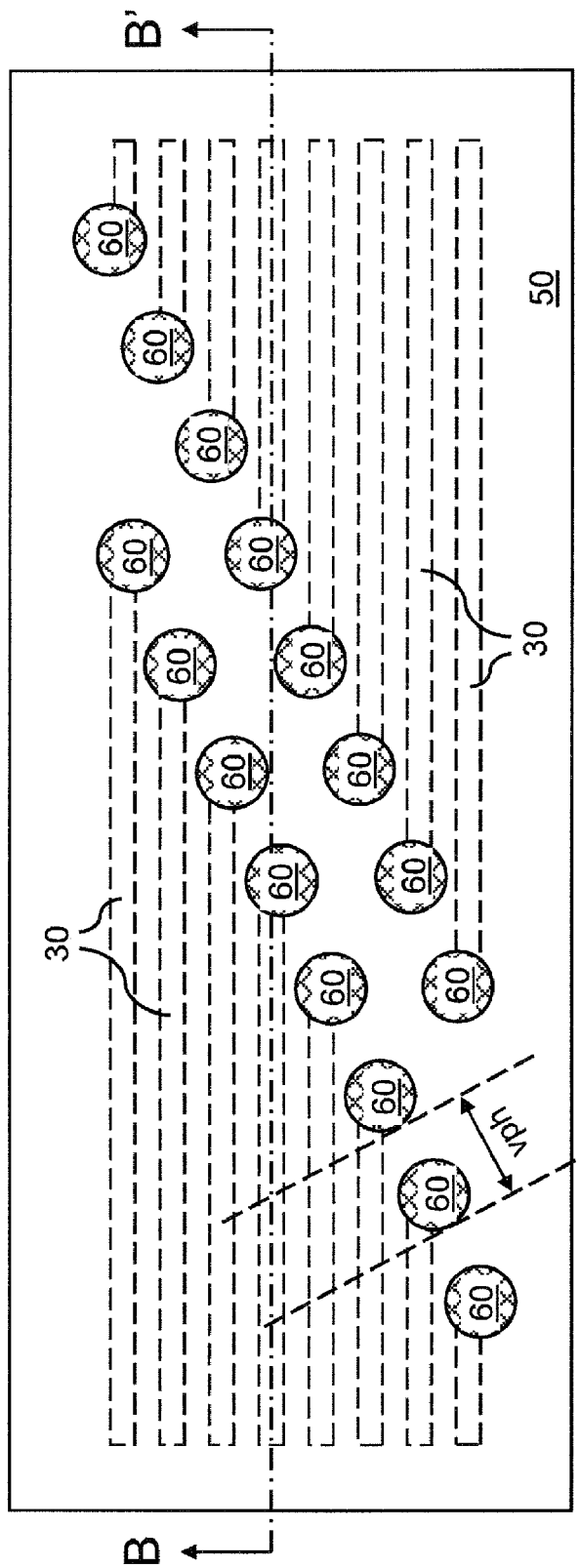
Figure 9B:
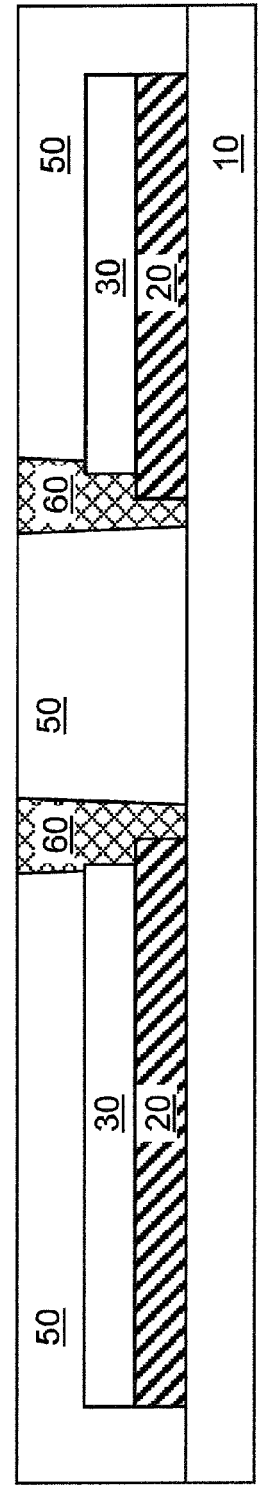

Referring to FIGS. 9A and 9B, a first dielectric layer 50 is formed over the plurality of dielectric material portions 30, the first plurality of conductive lines 20, and the substrate 10, and is planarized, for example, by chemical mechanical planarization (CMP) or by self-planarization as described above. A plurality of via holes is formed along the end walls of the plurality of conductive lines 20. Sidewalls of the plurality of dielectric material portions 30 and top surfaces of the first plurality of conductive lines 20 are exposed within the plurality of via holes. A conductive material is filled within the plurality of via holes to form a plurality of conductive vias 60. Each of the plurality of conductive vias 60 contacts an end portion of one of the plurality of conductive lines 20 and is embedded in the first dielectric layer 50. The plurality of dielectric material portions 30 are shown in dotted lines in FIG. 9A to illustrate the spatial alignment between the plurality of dielectric material portions 30 and the plurality of conductive vias 60. The plurality of conductive vias 60 is arranged in two rows that are separated by the same distance as the distance between the two sidewalls of the photoresist layer 47 prior to removal (See FIGS. 8A and 8B). The plurality of conductive vias 60 has a via pitch vph in each row.

Referring to FIGS. 10A and 10B, a second dielectric layer 70 is formed over the first dielectric layer 50 as described above. Further, a second plurality of conductive lines 80 is formed in the manner described above. The second plurality of conductive lines 80 has the second pitch ph2, which is a lithographic pitch. The relationship between the orientations of the first vertical plane P1, the second vertical plane P2, and the third vertical plane P3 is the same as described above.

Referring to FIGS. 11A and 11B, a second variation on the first exemplary structure is derived from the first exemplary structure of FIGS. 2A and 2B by applying a photoresist layer 47 and lithographically patterning the photoresist layer 47 to include a pair of parallel vertical sidewalls that are at an angle α from the first plane P1. The pair of parallel vertical sidewalls are separated by a lithographic dimension, i.e., at a distance greater than 35 nm, and typically, at a distance greater than 100 nm. One of the vertical sidewall of the photoresist layer 47 is a second vertical plane P2. The angle α between the first vertical plane P1 and the second vertical plane P2 is less than 45 degrees, and is preferably less than 30 degrees, and more preferably from 5 degrees to 20 degrees.

Exposed portions of the stacks of the plurality of dielectric material portions 30 and the first plurality of conductive lines 20 are removed by an anisotropic etch, such as a reactive ion etching, employing the photoresist layer 47 as an etch mask. The end walls of the plurality of dielectric material portions 30 and the first plurality of conductive lines 20 are vertically coincident with the vertical sidewalls of the photoresist layer 47 immediately after the anisotropic etch, and are at the angle a relative to the first vertical plane P1, which is parallel to the sidewalls of the plurality of dielectric material portions 30 and the first plurality of conductive lines 20. The photoresist layer 47 is subsequently removed.

Referring to FIGS. 12A and 12B, an angled reactive ion etch is performed so that the direction of impinging ions is tilted away from the second vertical plane P2. The direction of the impinging ions is schematically shown by the arrows in FIGS. 12A and 12B. Thus, the end walls of the plurality of dielectric material portions 30 on the second vertical plane P2 are subjected to etching by the impinging ions, while the end walls of the plurality of dielectric material portions 30 on a plane (herein referred to as an "offset plane OP") that is parallel to the second vertical plane P2 and laterally offset from the second vertical plane P2 by the width of the opening in the photoresist layer 47 are protected from the impinging ions during the angled reactive ion etch. Preferably, the angled reactive ion etch forms etch residues from the plurality of dielectric material portions 30, and the end walls of the first plurality of conductive lines 20 that coincide with the offset plane OP are covered with a dielectric residue spacer 32, which includes a dielectric material that flow down from the plurality of dielectric material portions 30. Thus, the end walls of the plurality of dielectric material portions 30 and the end walls of the first plurality of conductive lines 20 in the offset plane OP are covered with the dielectric residue spacer 32.

Figure 13A:
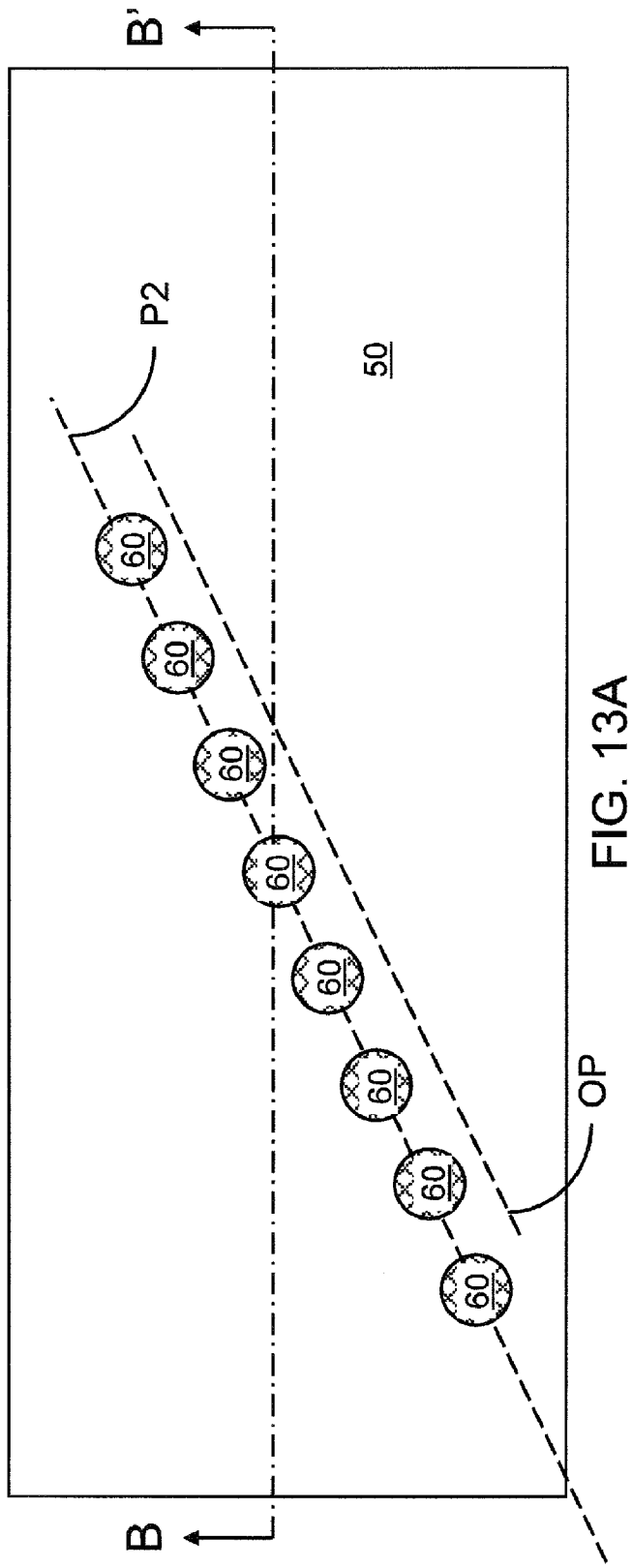
Figure 13B:
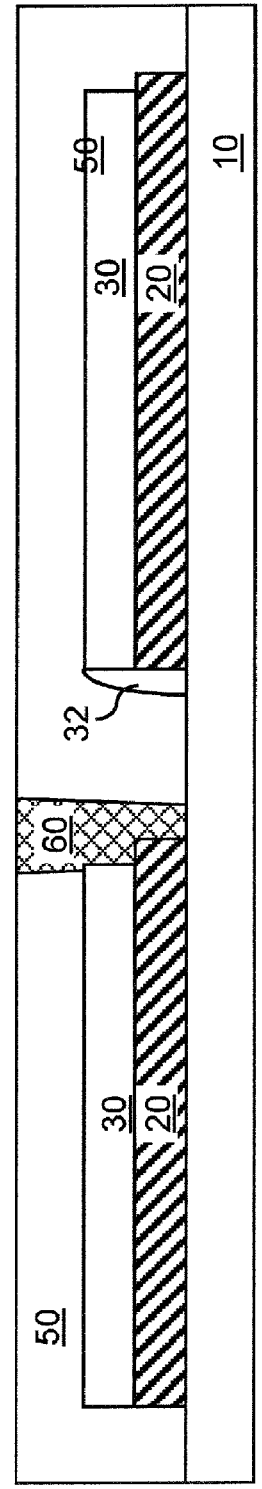

Referring to FIGS. 13A and 13B, a first dielectric layer 50 is formed over the plurality of dielectric material portions 30, the first plurality of conductive lines 20, and the substrate 10, and is planarized as described above. A plurality of via holes is formed along the end walls of the plurality of conductive lines 20. A plurality of conductive vias 60 is formed in the first dielectric layer 50 as described above. The dielectric residue spacer 32 protects the sidewalls of the subset of the first plurality of conductive lines 20 that have end walls on the offset plane OP, i.e., that do not have end walls on the second vertical plane P2. Therefore, unwanted electrical contacts between the plurality of conductive vias 60 and the subset of the first plurality of conductive lines 20 that have end walls on the offset plane OP are avoided due to the presence of the dielectric residue spacer 32.

Figure 14A:
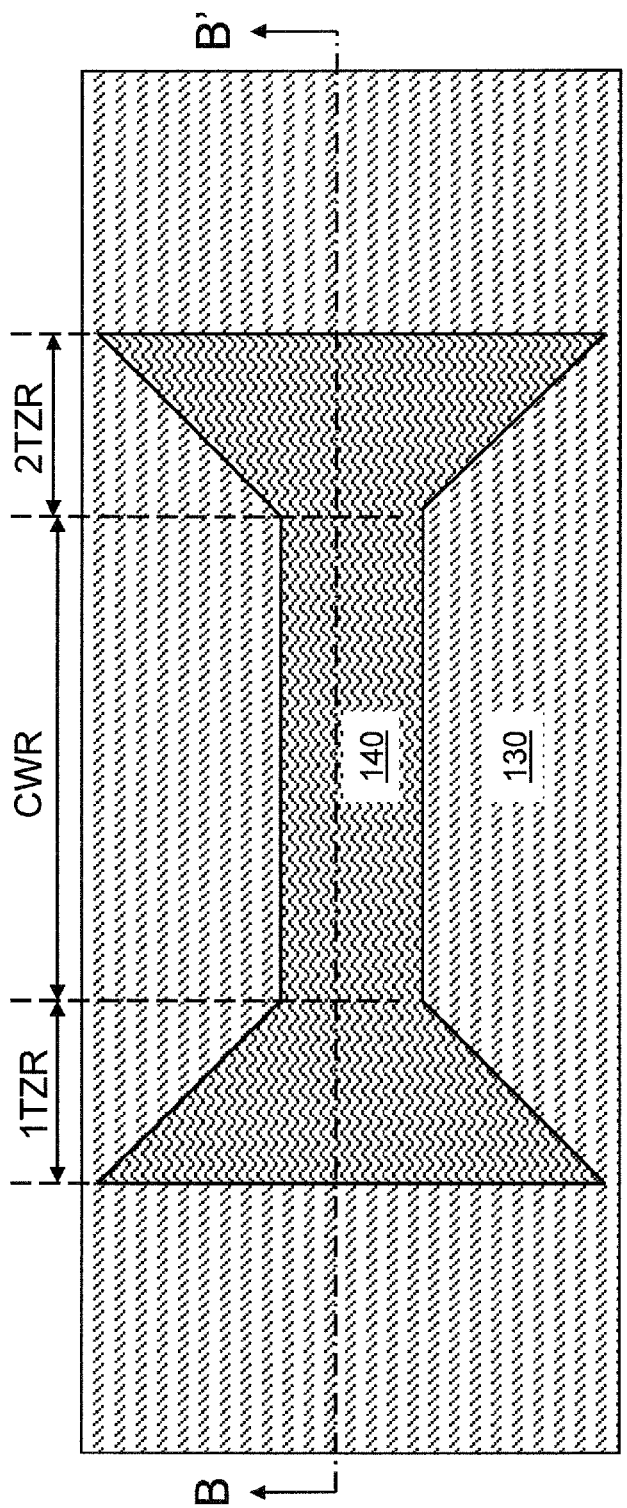
Figure 14B:
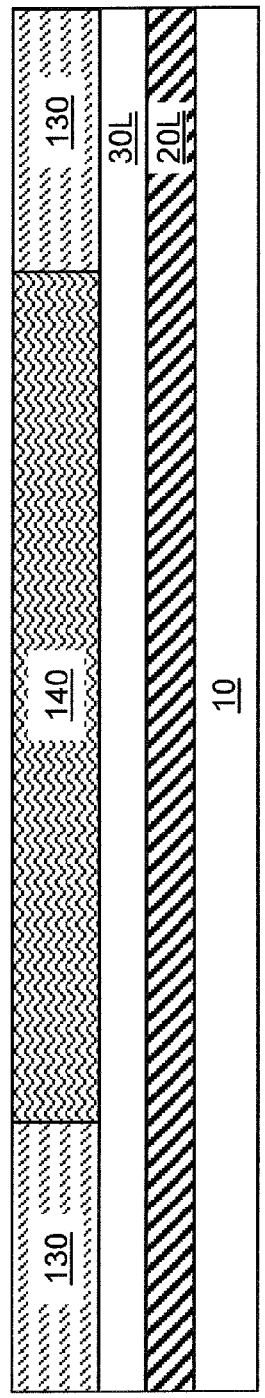

Referring to FIGS. 14A and 14B, a second exemplary structure according to a second embodiment of the present invention includes a substrate 10, a conductive material layer 20L formed on a top surface thereof, a dielectric material layer 30L, a template layer 130 having a recessed area, and a block copolymer layer 140 that fills the recessed area in the template layer 130. The recessed area includes a region having a constant width, or a "constant width region (CWR)," and at least one trapezoidal region adjoined to the constant width region and having a varying width. Each of the at least one trapezoidal region is a flared region in which the width changes in a lateral direction. The constant width region has two parallel edges in the lengthwise direction, which is the direction of the plane B-B' in FIG. 14A. The at least one trapezoidal region may include a first trapezoidal region ("1TZR") adjoined to one end of the constant width region and a second trapezoidal region ("2TZR') adjoined to another end of the constant width region. The compositions of the substrate 10, the conductive material layer 20L, and the dielectric material layer 30L may be the same as in the first embodiment. In the second embodiment, the dielectric material layer 30L is optional, and the template layer 130 may be formed directly on the conductive material layer 20L in the absence of the dielectric material layer 30L in some cases. The template layer 130 typically includes a dielectric material such as silicon nitride, silicon oxide, silicon oxynitride, or other dielectric materials known in semiconductor manufacturing technology.

The block copolymer layer 140 including two or more immiscible polymeric block components is capable of self-organizing into nanometer-scale patterns. In addition, the block copolymer layer 140 includes at least one "homopolymer" that enables formation of sublithographic patterns having a varying distance between polymer block lines 40. A homopolymer is a chemical that may be added to two or more immiscible polymeric block components to enhance the range of self-alignment in a geometry that has a non-constant pitch. For example, a trapezoidal region in a recess is a geometry that has a non-constant pitch. Non-limiting examples of homopolymers include PS 45K and PMMA 46.5K.

Referring to FIGS. 15A and 15B, the block copolymer layer 140 is subjected to a condition that induces separation and self-assembly of the immiscible polymeric block components. For example, the block copolymer layer 140 maybe annealed at an elevated temperature. Dimensions of the structural units so formed are typically in the range of 5 to 30 nm, which are sub-lithographic.

Under suitable conditions, the block copolymer layer 140 separates into a plurality of polymer block lines 140A containing a first polymeric block component and a block component matrix 140B containing a second polymeric block component. The portion of the plurality of polymer block lines 140A within the constant width region CWR has a first pitch ph1, which is a sublithographic pitch. The first pitch ph1 may be a sublithographic pitch, i.e., a pitch that is less than the critical pitch for a periodic array of parallel line patterns as described above. Preferably, the first pitch ph1 is from 8 nm to 60 nm, and more preferably, from 16 nm to 40 nm, although lesser and greater dimensions for the first pitch ph1 can also be employed. The pitch of the portion of the plurality of polymer block lines 140A within the first and second trapezoidal regions (1TZR, 2TZR) increases with distance from the constant width region CWR until the plurality of polymer block lines 140A forms a random pattern.

Referring to FIGS. 16A and 16B, the block component matrix 140B and the template layer 130 are removed selective to the plurality of polymer block lines 140A and the dielectric material layer 30L. The plurality of polymer block lines 140A has the first pitch ph1 in the constant width region CWR, and a varying distance between a neighboring pair of the first plurality of conductive lines within a first varying spacing region 1VSR and a second varying spacing region 1VSR. The first varying spacing region 1VSR is the portion of the first trapezoidal region 1TZR (See FIG. 15A) in which the plurality of polymer block lines 140A form non-parallel divergent lines with a varying distance between a neighboring pair of polymer block lines 140A. Likewise, the second varying spacing region 2VSR is the portion of the second trapezoidal region 2TZR (See FIG. 15A) in which the plurality of polymer block lines 140A form non-parallel divergent lines with a varying distance between a neighboring pair of polymer block lines 140A. In the first and second varying spacing regions (1VSR, 2VSR), the varying distance increases with a lateral distance from an end portion of the constant width region CWR.

Referring to FIGS. 17A and 17B, the sublithographic pattern, i.e., a pattern with at least one sublithographic dimension, in the plurality of polymer block lines 140A is transferred into the stack of the dielectric material layer 30L and the conductive material layer 20L, for example, by an anisotropic ion etch employing the plurality of polymer block lines 140A as an etch mask. The remaining portions of the dielectric material layer 30L constitutes a plurality of dielectric material portions 30. The remaining portions of the conductive material layer 20L constitute a first plurality of conductive lines 20 having the first pitch ph1. The sidewalls of the first plurality of conductive lines 20, the plurality of dielectric material portions 30, and the plurality of polymer block lines 140A are vertically coincident.

Referring to FIGS. 18A and 18B, a photoresist layer 147 is applied on the vertical stack of the plurality of polymer block lines 140A, the plurality of dielectric material portions 30, and the first plurality of conductive lines 20 and on the exposed portions of the substrate 10. The photoresist layer 147 is lithographically patterned to cover all of the constant width region CWR and substantial portions of the first and second varying spacing regions (1VSR, 2VSR). Preferably, at least 50%, and preferably 80%, of the area of the each of the first and second varying spacing regions (1VSR, 2VSR) are covered by the photoresist layer 147. After lithographic patterning of the photoresist layer 147, the plurality of polymer block lines 140A has a lithographic pitch at each sidewall of the photoresist layer in the first and second varying spacing regions (1VSR, 2VSR). The portions of the plurality of polymer block lines 140A having a random pattern and located outside the first and second varying spacing regions (1VSR, 2VSR) are located outside the area covered by the photoresist layer 147.

Referring to FIGS. 19A and 19B, the exposed portions of the stack of the plurality of polymer block lines 140A, the plurality of dielectric material portions 30, and the first plurality of conductive lines 20 are removed, for example, by an anisotropic etch that employs the photoresist layer 147 as an etch mask. Subsequently, the photoresist layer 147 and the remaining portions of the plurality of polymer block lines 140A within the area of the photoresist layer 147 are removed selective to the plurality of dielectric material portions 30, the first plurality of conductive lines 20, and the substrate 10.

The vertical stack of the plurality of dielectric material portions 30 and the first plurality of conductive lines 20 includes the constant width region CWR, the first varying spacing region 1VSR, and the second varying spacing region 2VSR. The first plurality of conductive lines 20 has a constant first pitch phi within the constant width region CWR and a varying distance vd between a neighboring pair of the first plurality of conductive lines 20 within the first varying spacing region 1VSR and the second varying spacing region 2VSR. The varying distance vd increases with a lateral distance ld from an end portion of the constant width region CWR.

Referring to FIGS. 20A and 20B, a first dielectric layer 50 is formed over the plurality of dielectric material portions 30, the first plurality of conductive lines 20, and the substrate 10, and is planarized, for example, by chemical mechanical planarization (CMP) or by self-planarization. The first dielectric layer 50 may comprise the same material as in the first embodiment of the present invention.

A plurality of via holes is formed at a second pitch ph2 so that the top surfaces and sidewall surface of one of the plurality of conductive lines 20 are exposed within each via hole. The plurality of via holes may be formed in each of the first varying spacing region 1VSR and the second varying spacing region 2VSR, or only in one of the first varying spacing region 1VSR and the second varying spacing region 2VSR. A conductive material is filled within the plurality of via holes to form a plurality of conductive vias 60, which may be aligned in a line and have the periodicity of the second pitch ph2. Each of the plurality of conductive vias 60 contacts an end portion of one of the plurality of conductive lines 20 and is embedded in the first dielectric layer 50. The second pitch ph2 is a lithographic pitch, i.e., a pitch that is equal to or greater than a minimum pitch that may be formed by lithographic methods. For example, the lithographic pitch may be equal to, or greater than, 70 nm. The plurality of dielectric material portions 30 are shown in dotted lines in FIG. 20A to illustrate the spatial alignment between the plurality of dielectric material portions 30 and the plurality of conductive vias 60.

Figure 21A:
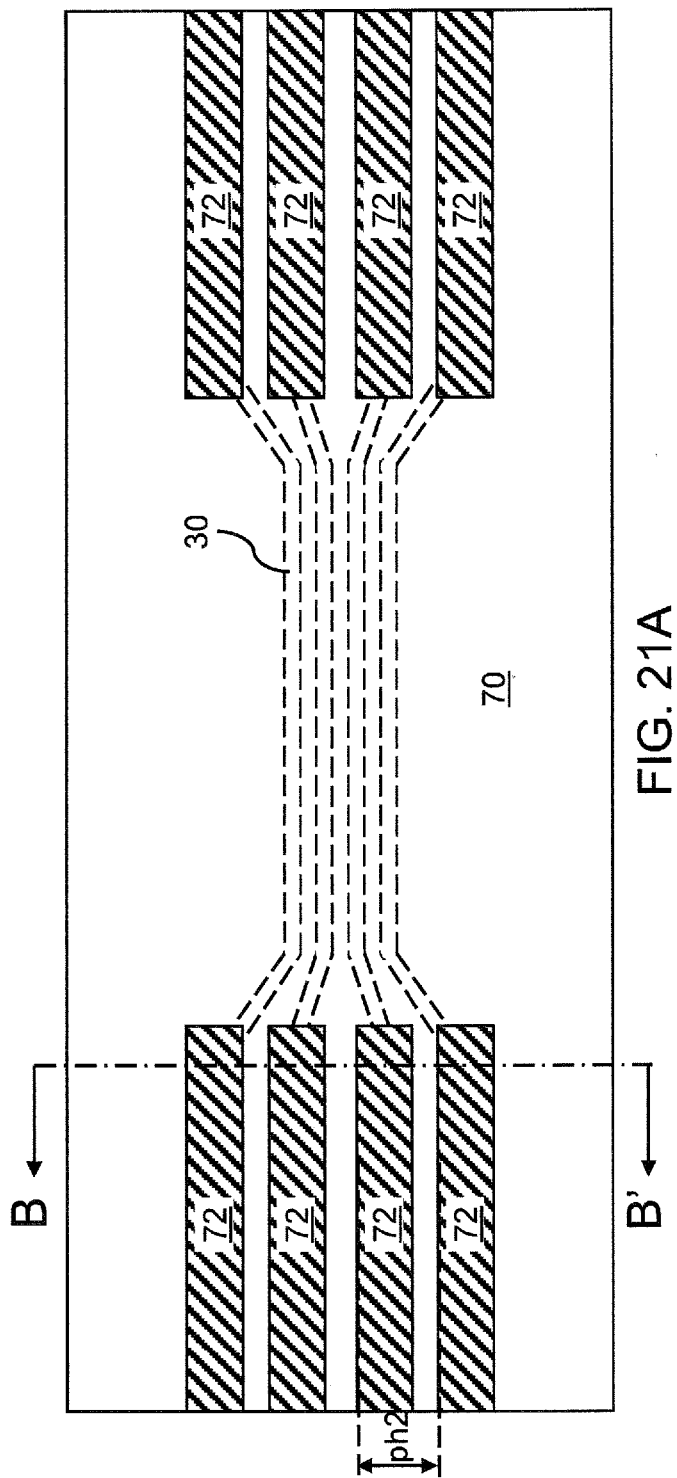
Figure 21B:
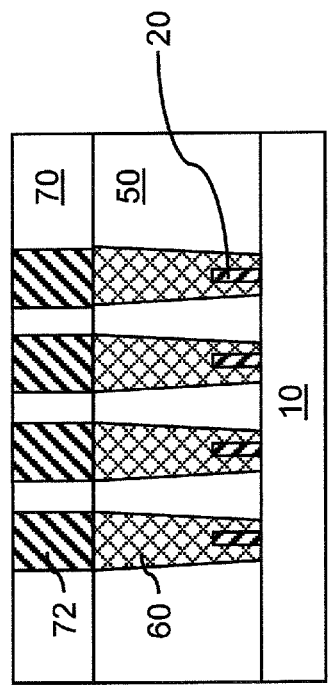

Referring to FIGS. 21A and 21B, a second dielectric layer 70 is formed over the first dielectric layer 50 in the same manner as in the first embodiment. A plurality of line trenches having a lithographic pitch is formed in the second dielectric layer 70. Preferably, the lithographic pitch of the plurality of trenches is the same as the second pitch ph2. A second plurality of conductive lines 80 is formed within the plurality of line trenches by deposition of a conductive material and planarization. The second plurality of conductive lines 80 may include any of the material that may be employed as the first plurality of conductive lines 20. Preferably, the second plurality of conductive lines 80 has the second pitch ph2.

The lengthwise direction, i.e., the horizontal direction in the plane including the sidewalls, of the second plurality of conductive lines 80 may be the same as the lengthwise direction of the first plurality of conductive lines 20. A bottom surface of each of the second plurality of conductive lines 80 abuts one of the plurality of conductive vias 60.

Alternatively, the first dielectric layer 50 and the second dielectric layer 70 may be formed in the same deposition step as a single dielectric layer, and the plurality of conductive vias 60 and the second plurality of conductive lines 80 may be formed integrally by the same deposition and planarization process.

Figure 22A:
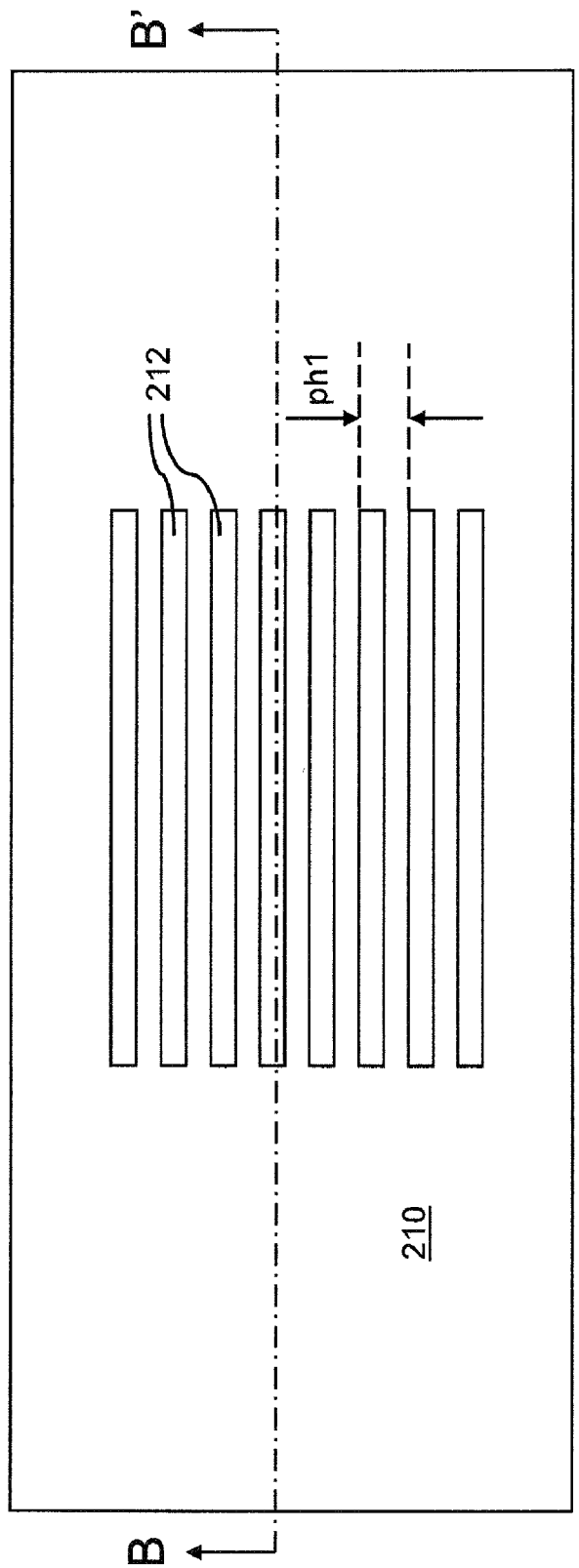
Figure 22B:
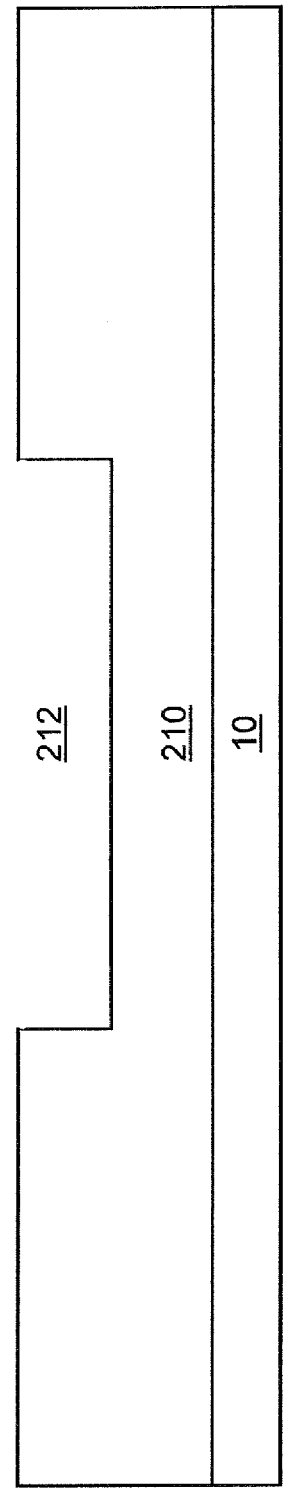

Referring to FIGS. 22A and 22B, a third exemplary structure according to a third embodiment of the present invention includes a substrate 10 and a dielectric layer 210 including a first plurality of line trenches 212 having a first pitch ph1. The substrate 10 may be the same as in the first and second embodiments. The dielectric layer 210 may include the same material that may be employed as the first dielectric layer 50 in the first and second embodiments.

The first plurality of line trenches 212 may be formed employing self-assembling block copolymers. A pattern in the plurality of polymer block lines is transferred into the dielectric layer 210 by an anisotropic etch. For example, a template layer (not shown) is deposited on the top surface of the dielectric layer 210. The template layer is patterned to include a recessed area within which the top surface of the dielectric layer 210 is exposed. The recessed area of the template layer has two parallel edges in the lengthwise direction. A block copolymer layer (not shown) including self-assembling block copolymers are applied into the recessed area and induced to self-assemble as in the first and second embodiments. Once the block copolymer layer is transformed into an assembly of a plurality of polymer block lines (not shown) containing a first polymeric block component and a polymeric block matrix (not shown) containing a second polymeric block component, the plurality of polymer block lines is removed selective to the polymeric block matrix and the template layer. The pattern of the openings within the polymeric block matrix is transformed into the dielectric layer 210 to form the first plurality of line trenches 212. The polymeric block matrix and the template layer are removed selective to the dielectric layer 210 to provide the third exemplary structure of FIGS. 22A and 22B.

The first pitch ph1 may be a sublithographic pitch. Preferably, the first pitch ph1 is from 8 nm to 60 nm, and more preferably, from 16 nm to 40 nm, although lesser and greater dimensions for the first pitch ph1 can also be employed.

Figure 23A:
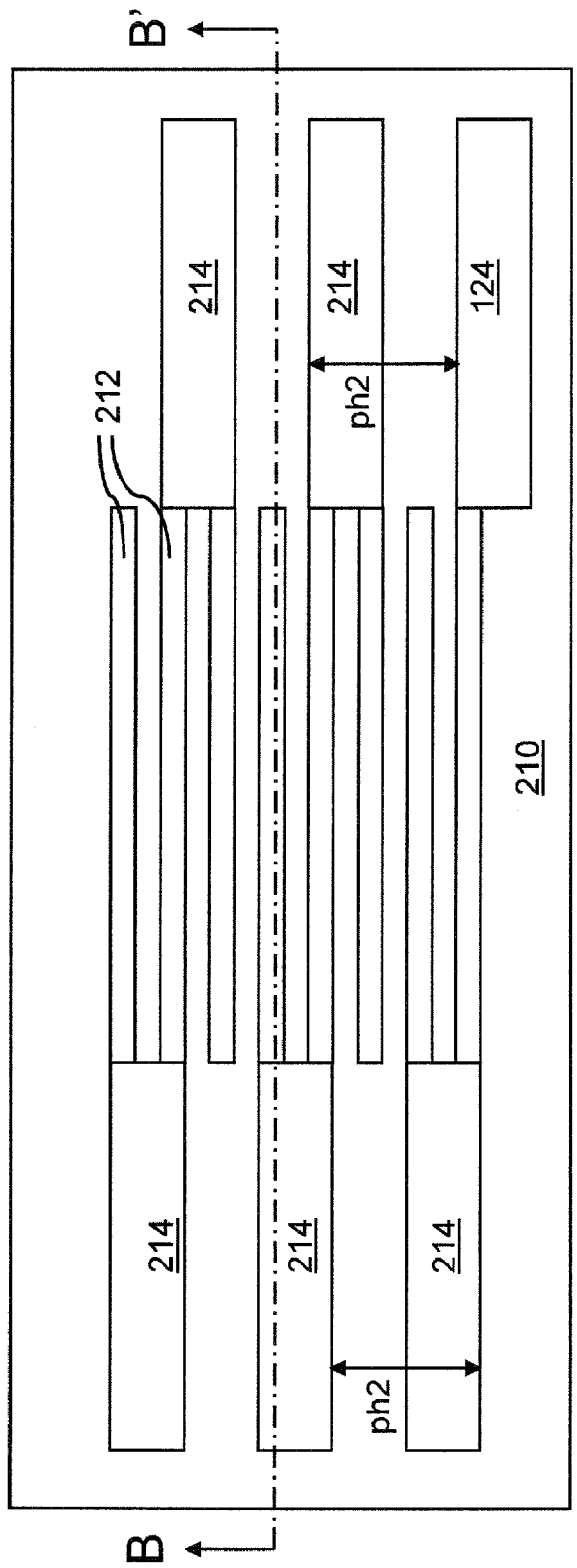
Figure 23B:
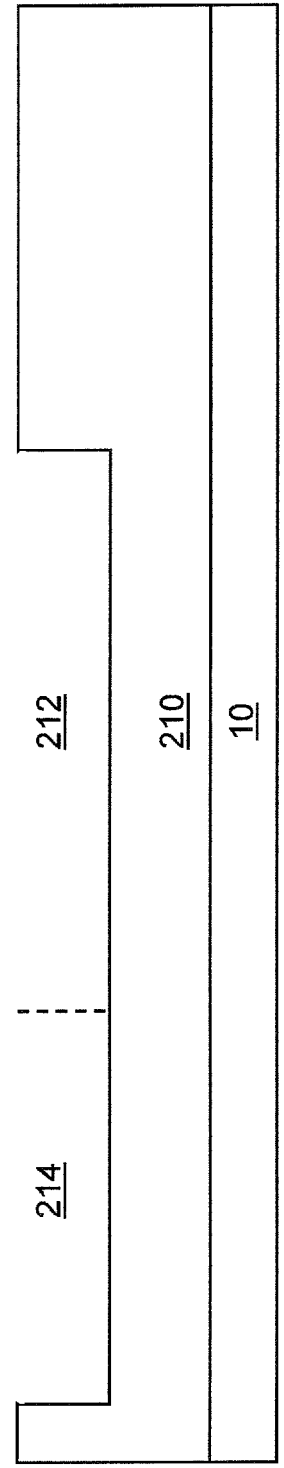

Referring to FIGS. 23A and 23B, a second plurality of line trenches 214 is formed on end portions of the first plurality of line trenches 212 by lithographic means. For example, a photoresist layer (not shown) may be applied and lithographically patterned to form openings therein. The pattern of the openings in the photoresist layer is transferred into the dielectric layer 210 to form the second plurality of line trenches 214. The second plurality of line trenches 214 has a second pitch ph2, which is a lithographic pitch. Each of the second plurality of line trenches 214 laterally adjoins and is connected to at least one of the first plurality of line trenches 212. At least one of the second plurality of line trenches 214 laterally adjoins and is connected to at least two of the first plurality of line trenches 212.

Referring to FIGS. 24A and 24B, a conductive material is deposited within the first plurality of line trenches 212 and the second plurality of line trenches 214 concurrently. The conductive material may be any material that may be employed as the first plurality of conductive lines 20 in the first and second embodiments. The excess conductive material is removed by planarization from above the top surface of the dielectric layer 210. The remaining portions of the conductive material within the first plurality of line trenches 212 constitute a first plurality of conductive lines 222, and the remaining portions of the conductive material within the second plurality of line trenches 214 constitute a second plurality of conductive lines 224.

The first plurality of conductive lines 222 is embedded in dielectric layer 210 and has the first pitch ph1, and the second plurality of conductive lines 224 is embedded in the dielectric layer 210 and has the second pitch ph2. The second pitch ph2 is a lithographic pitch, and is greater than the first pitch ph1, which is a sublithographic pitch. Each of the first plurality of conductive lines 222 is resistively connected to at least one of the second plurality of conductive lines 224 through integral construction, i.e., because of formation as a single contiguous piece. At least one of the second plurality of conductive lines 224 is resistively connected to at least two of the first plurality of conductive lines 222 through integral construction. The first plurality of conductive lines 222 and the second plurality of conductive lines 224 have the same conductive material. The first plurality of conductive lines 222 and the second plurality of conductive lines 224 have top surfaces that are coplanar to one another. The sidewall surfaces of the first plurality of conductive lines 222 and the sidewalls surfaces of the second plurality of conductive lines 224 are parallel to one another. The horizontal direction in the sidewall surfaces of the first plurality of conductive lines 222 and the sidewalls surfaces of the second plurality of conductive lines 224 is the lengthwise direction of the first plurality of conductive lines 222 and the sidewalls surfaces of the second plurality of conductive lines 224.

Figure 25A:
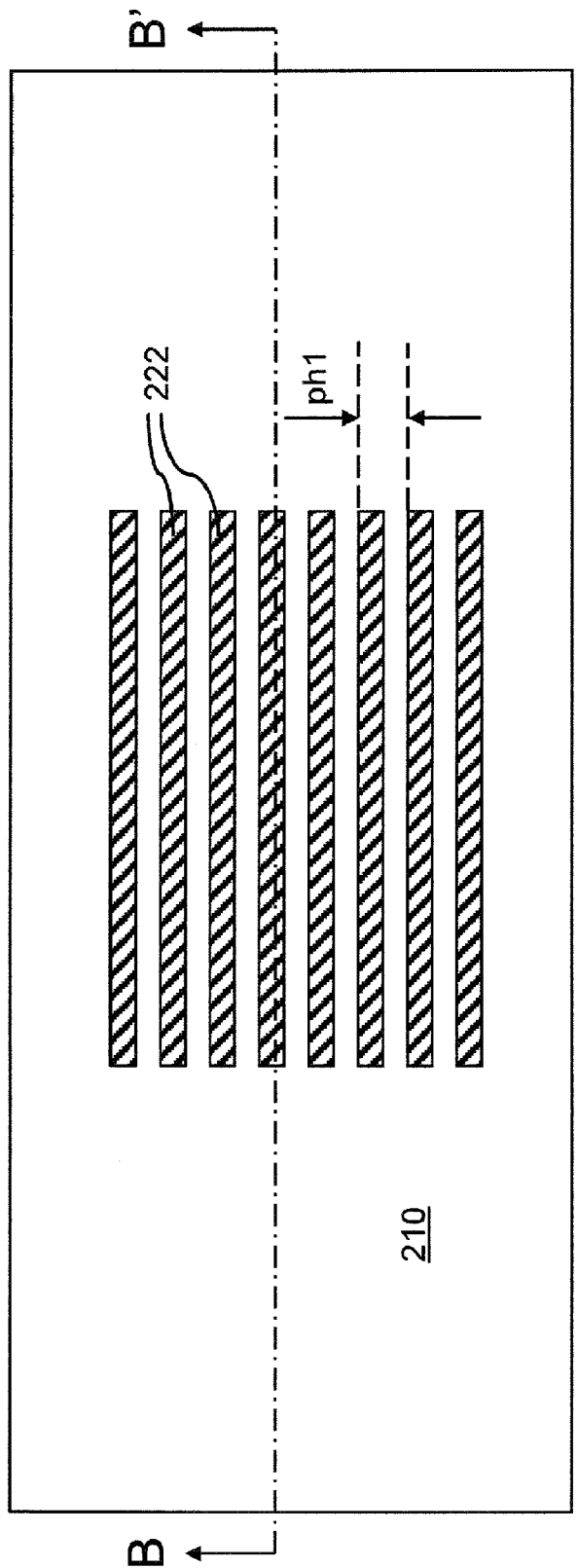
Figure 25B:
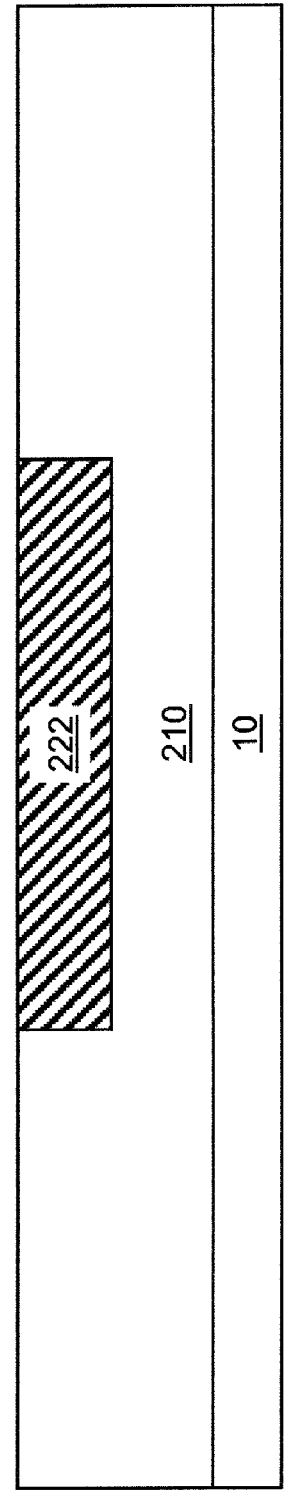

Referring to FIGS. 25A and 25B, a first variation on the third exemplary structure is derived from the third exemplary structure in FIGS. 22A and 22B by depositing a first conductive material within the first plurality of line trenches 212 and removing the excess of the first conductive material from above the top surface of the dielectric layer 210 by planarization. The remaining portions of the first conductive material within the first plurality of line trenches 212 constitute a first plurality of conductive lines 222. The first plurality of conductive lines 222 are embedded in dielectric layer 210 and has the first pitch ph1, which is a sublithographic pitch.

Referring to FIGS. 26A and 26B, a second plurality of line trenches 214 is formed on end portions of the first plurality of conductive lines 222 by lithographic means. For example, a photoresist layer (not shown) may be applied and lithographically patterned to form openings therein. The pattern of the openings in the photoresist layer is transferred into the dielectric layer 210 to form the second plurality of line trenches 214. The second plurality of line trenches 214 has a second pitch ph2, which is a lithographic pitch. At least one end wall of the first plurality of conductive lines 222 is exposed within each of the second plurality of line trenches 214. At least one of the second plurality of line trenches 214 laterally adjoins and is connected to at least two of the first plurality of line trenches 212.

Referring to FIGS. 27A and 27B, a second conductive material is deposited within the second plurality of line trenches 214. The excess of the second conductive material is removed by planarization from above the top surface of the dielectric layer 210. The remaining portions of the second conductive material within the second plurality of line trenches 214 constitute a second plurality of conductive lines 224. The second plurality of conductive lines 224 is embedded in the dielectric layer 210 and has the second pitch ph2. The second pitch ph2 is a lithographic pitch, and is greater than the first pitch ph1, which is a sublithographic pitch. Each of the first plurality of conductive lines 222 is resistively connected to at least one of the second plurality of conductive lines 224 through direct contact. At least one of the second plurality of conductive lines 224 is resistively connected to at least two of the first plurality of conductive lines 222 through direct contact. The first plurality of conductive lines 222 and the second plurality of conductive lines 224 may have the same conductive material, or may have different conductive materials. Each of the first and second conductive materials may be any material that may be employed as the first plurality of conductive lines 20 in the first and second embodiments. The first plurality of conductive lines 222 and the second plurality of conductive lines 224 have top surfaces that are coplanar to one another. The sidewall surfaces of the first plurality of conductive lines 222 and the sidewalls surfaces of the second plurality of conductive lines 224 are parallel to one another. The horizontal direction in the sidewall surfaces of the first plurality of conductive lines 222 and the sidewalls surfaces of the second plurality of conductive lines 224 is the lengthwise direction of the first plurality of conductive lines 222 and the sidewalls surfaces of the second plurality of conductive lines 224.

Figure 28A:
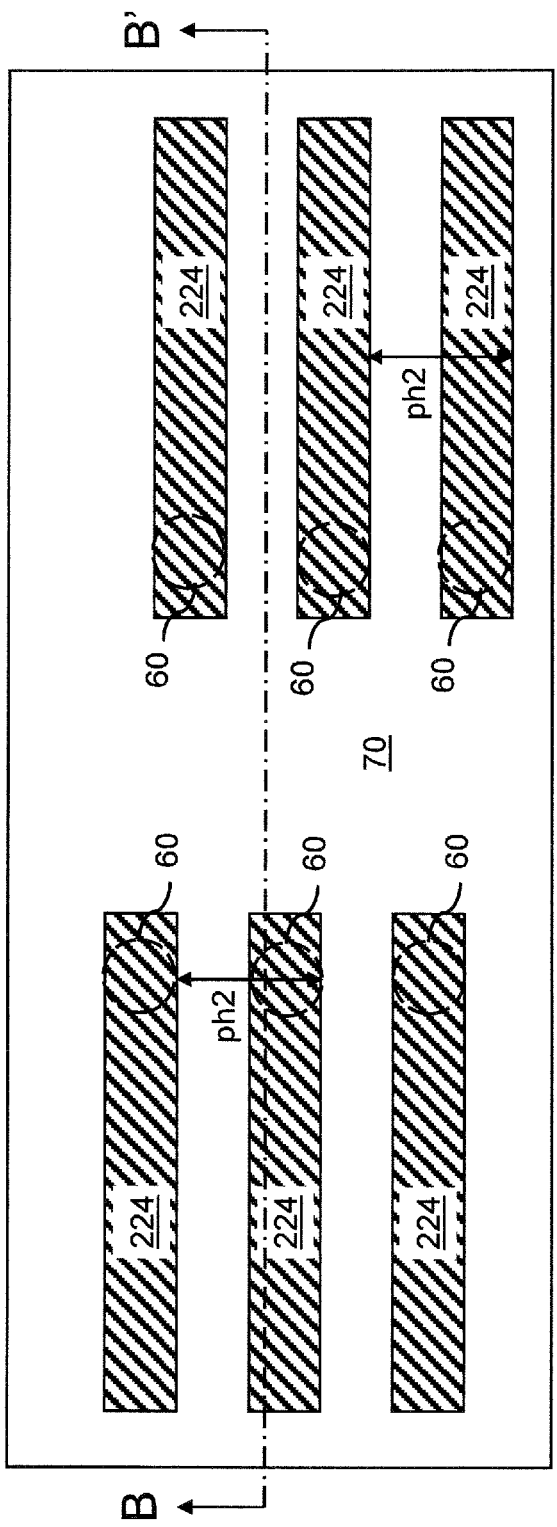
FIGS. 28A and 28B are views of a second variation on the third exemplary structure according to the third embodiment of the present invention.
Figure 28B:
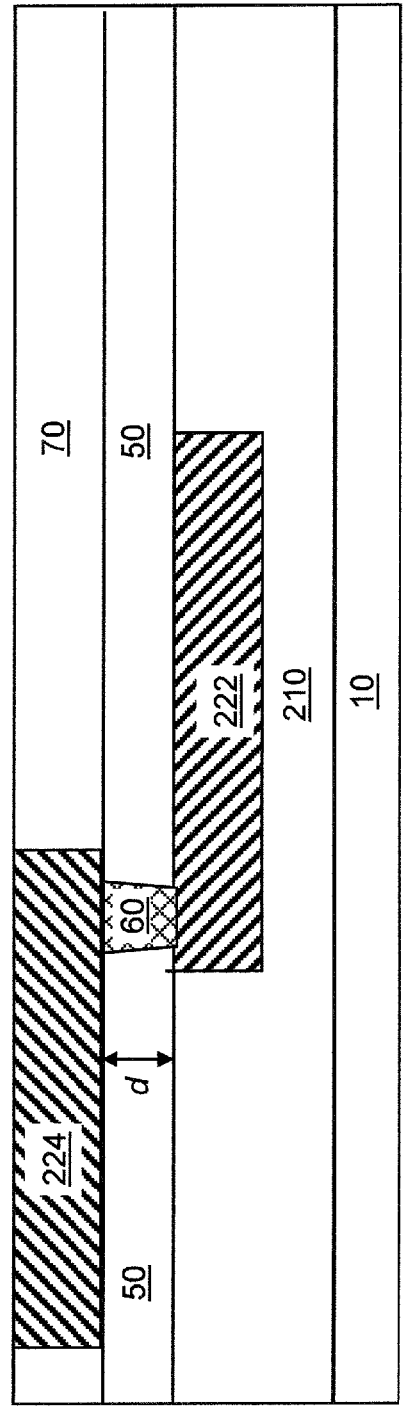

Referring to FIGS. 28A and 28B, a second variation on the third exemplary structure is derived from the first variation on the third exemplary structure of FIGS. 25A and 25B by forming a first dielectric layer 50 over the dielectric layer 210. A plurality of via holes is formed at a second pitch ph2 within the first dielectric layer 50 and optionally in underlying portions of the dielectric layer 210 so that the top surfaces of at least one of the first plurality of conductive lines 222 are exposed within each via hole. Optionally, the underlying area of the first dielectric layer 210 may be removed to expose sidewalls of the first plurality of conductive lines 222 are also exposed. A conductive material is filled within the plurality of via holes to form a plurality of conductive vias 60, which may be aligned in a line and have the periodicity of a second pitch ph2. The second pitch ph2 is a lithographic pitch, i.e., a pitch that is equal to or greater than a minimum pitch that may be formed by lithographic methods. For example, the lithographic pitch may be equal to, or greater than, 70 nm.

A second dielectric layer 70 is deposited over the first dielectric layer 50 in the same manner as in the first embodiment of the present invention. A second plurality of line trenches is formed in the second dielectric layer 70 by lithographic means. For example, a photoresist layer (not shown) may be applied and lithographically patterned to form openings therein. The pattern of the openings in the photoresist layer is transferred into the second dielectric layer 70 to form the second plurality of line trenches. The second plurality of line trenches is filled with a second conductive material and planarized to form a second plurality of conductive lines 224, which has the second pitch ph2.

Each of the first plurality of conductive lines 222 is resistively connected to at least one of the second plurality of conductive lines 224 through direct contact. At least one of the second plurality of conductive lines 224 is resistively connected to at least two of the first plurality of conductive lines 222 through one of the plurality of conductive vias 60. Each of the first and second conductive materials may be any material that may be employed for the first plurality of conductive lines 20 in the first and second embodiments. The first plurality of conductive lines 222 is vertically separated from the second plurality of conductive lines 224 by a distance d and each of the second plurality of conductive lines 224 contacts a conductive via 60 that contacts at least one of the first plurality of conductive lines 222. At least one of the plurality of conductive vias 60 contacts at least two of the first plurality of conductive lines 222. Some of the first plurality of conductive lines 222 may be resistively connected to only one of the plurality of conductive vias 60 and only one of the second plurality of conductive lines 224. At least one of the plurality of conductive vias 60 is resistively connected to at least two of the first plurality of conductive lines 222. Each of the plurality of conductive vias 60 may be resistively connected to only one of the second plurality of conductive lines 224. The sidewall surfaces of the first plurality of conductive lines 222 and the sidewalls surfaces of the second plurality of conductive lines 224 are parallel to one another. The horizontal direction in the sidewall surfaces of the first plurality of conductive lines 222 and the sidewalls surfaces of the second plurality of conductive lines 224 is the lengthwise direction of the first plurality of conductive lines 222 and the sidewalls surfaces of the second plurality of conductive lines 224.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A structure comprising:
   a first plurality of conductive lines having a first pitch and embedded in at least one dielectric layer, wherein each of said first plurality of conductive lines has a pair of sidewalls that are parallel to a first vertical plane and an end wall located within a second vertical plane and a bottom surface in contact with a top planar surface of a substrate, wherein an angle between said first vertical plane and said second vertical plane is less than 45 degrees;
   a plurality of conductive vias, wherein each of said plurality of conductive vias contacts an end portion of one of said plurality of conductive lines and is embedded in said at least one dielectric layer, and wherein said second vertical plane intersects each of said plurality of conductive vias; and
   a plurality of dielectric material portions having said first pitch and vertically contacting, and spaced from said substrate by, said first plurality of conductive lines, wherein each sidewall of said plurality of dielectric material portions coincides with a plane of a sidewall of first plurality of conductive lines and each end wall of said plurality of dielectric material portions is offset from said second vertical plane by a constant distance.

2. The structure of claim 1, further comprising a second plurality of conductive lines having a second pitch and embedded in said at least one dielectric layer, wherein a bottom surface of each of said second plurality of conductive lines abuts one of said plurality of conductive vias.

3. The structure of claim 2, wherein said first pitch is a sublithographic pitch and said second pitch is a lithographic pitch.

4. The structure of claim 1, wherein each of said plurality of conductive vias contacts a horizontal top surface and one of said end walls of said first plurality of conductive lines.

5. The structure of claim 1, further comprising a semiconductor substrate including at least one semiconductor device and located underneath said at least one dielectric layer.

6. The structure of claim 1, wherein each bottom surface of said plurality of dielectric material portions contacts a top surface of first plurality of conductive lines.

7. A structure comprising:
   a first plurality of conductive lines embedded in at least one dielectric layer and having a constant width region and at least one varying spacing region that adjoins said constant width region, wherein said first plurality of conductive lines has a constant first pitch within said constant width region and a varying pitch that linearly increases with distance from an end of said constant width region within said at least one varying spacing region, wherein said varying pitch increases with a lateral distance from an end portion of said constant width region; and
   a plurality of conductive vias having a second pitch, wherein each of said plurality of conductive vias contacts an end portion of one of said first plurality of conductive lines and is embedded in said at least one dielectric layer, wherein said second pitch is greater than said first pitch.

8. The structure of claim 7, further comprising a second plurality of conductive lines having a second pitch and embedded in said at least one dielectric layer, wherein a bottom surface of each of said second plurality of conductive lines abuts one of said plurality of conductive vias, wherein said second plurality of conductive lines has a pitch that is the same as said second pitch.

9. The structure of claim 8, wherein said first pitch is a sublithographic pitch and said second pitch is a lithographic pitch.

10. A structure comprising:
    a first plurality of conductive lines having a first pitch and embedded in at least one dielectric layer; and
    a second plurality of conductive lines having a second pitch and embedded in said at least one dielectric layer, wherein all top surfaces of said first plurality of conductive lines and all top surfaces of said second plurality of conductive lines are within a same horizontal plane as said at least one dielectric layer, said first pitch and said second pitch are along a same direction, and said second pitch is greater than said first pitch and at least one of said second plurality of conductive lines is resistively connected to at least two of said first plurality of conductive lines.

11. The structure of claim 10, wherein said first pitch is a sublithographic pitch and said second pitch is a lithographic pitch.

12. The structure of claim 10, wherein said first plurality of conductive lines and said second plurality of conductive lines have top surfaces that are coplanar to one another.

13. The structure of claim 10, wherein a vertical sidewall of said one of said plurality of conductive lines is adjoined to a vertical end wall of one of said plurality of conductive lines.

14. A method of forming a structure comprising:
    forming a plurality of stacks including a first plurality of conductive lines and a plurality of dielectric material portions on a substrate, wherein each stack among said plurality of stacks includes one of said first plurality of conductive lines and one of said plurality of dielectric material portions, and said plurality of stacks having a first pitch, wherein each of said first plurality of stacks has a pair of sidewalls that are parallel to a first vertical plane and vertically extending from a bottommost surface of said plurality of stacks to a topmost surface of said plurality of stacks;
    patterning said first plurality of conductive lines employing a photoresist having a sidewall along a second vertical plane, wherein an end wall of each of said patterned first plurality of conductive lines is formed within said second vertical plane, wherein an angle between said first vertical plane and said second vertical plane is less than 45 degrees;

forming a dielectric layer over said patterned first plurality of conductive lines; and forming a plurality of conductive vias in said dielectric layer, wherein each of said plurality of conductive vias contacts an end portion of one of said plurality of conductive lines and said second vertical plane intersects each of said plurality of conductive vias.

15. The method of claim 14, further comprising forming a second plurality of conductive lines having a second pitch in said dielectric layer, wherein each of said second plurality of conductive lines is formed directly on one of said plurality of conductive vias.

16. The method of claim 14, further comprising:

forming a plurality of polymer block lines having said first pitch employing a self-assembling copolymer layer; and transferring a pattern in said plurality of polymer block lines into a conductive material layer on said substrate, wherein remaining portions of said conductive material layer after said transferring constitutes said first plurality of conductive lines.

17. The method of claim 16, further comprising:

forming a dielectric material layer on said conductive material layer before said forming said plurality of polymer block lines, wherein said dielectric material layer is patterned during said transferring of said pattern to form dielectric material portions; and laterally recessing said dielectric material portions relative to said second vertical plane.

18. The method of claim 17, further comprising forming a plurality of via holes in said dielectric layer along said second vertical plane by lithographically patterning said dielectric layer, wherein sidewalls of said dielectric material portions and top surfaces of said first plurality of conductive lines are exposed within said plurality of via holes.

19. A method of forming a structure comprising:

forming a first plurality of conductive lines having a constant width region and at least one varying spacing region that adjoins said constant width region, wherein said first plurality of conductive lines has a constant first pitch within said constant width region and a varying pitch that linearly increases with distance from an end of said constant width region within said at least one varying spacing region, wherein said varying distance pitch with a lateral distance from an end portion of said constant width region;

forming a dielectric layer on said plurality of conductive lines; and forming a plurality of conductive vias having a second pitch within said dielectric layer, wherein each of said plurality of conductive vias contacts an end portion of one of said plurality of conductive lines, wherein said second pitch is greater than said first pitch.

20. The method of claim 19, further comprising forming a second plurality of conductive lines having said second pitch in said dielectric layer, wherein each of said second plurality of conductive lines is formed directly on one of said plurality of conductive vias.

21. The method of claim 19, further comprising:

forming a plurality of polymer block lines having said first pitch employing a self-assembling copolymer layer including a homopolymer; and transferring a pattern in said plurality of polymer block lines into a conductive material layer on said substrate, wherein remaining portions of said conductive material layer after said transferring constitutes said first plurality of conductive lines.

22. The method of claim 21, further comprising:

forming a template layer above said conductive material layer;

forming a recessed area in said template layer, wherein said recessed area includes a region having a constant width and a trapezoidal region adjoined to said constant width region and having a varying width, wherein said a constant width region is formed within said region having said constant width and said at least one varying spacing region is formed within said trapezoidal region.

23. A method of forming a structure comprising:

forming a first plurality of conductive lines having a first pitch in at least one dielectric layer; and forming a second plurality of conductive lines having a second pitch in said at least one dielectric layer, wherein all top surfaces of said first plurality of conductive lines and all top surfaces of said second plurality of conductive lines are within a same horizontal plane as said at least one dielectric layer, said first pitch and said second pitch are along a same direction, and said second pitch is greater than said first pitch and at least one of said second plurality of conductive lines is resistively connected to at least two of said first plurality of conductive lines.

24. The method of claim 23, wherein said first pitch is a sublithographic pitch and said second pitch is a lithographic pitch.

25. The method of claim 23, further comprising:

forming a first plurality of trenches extending downward from a surface of said at least one dielectric layer, wherein said first plurality of trenches has said first pitch; and forming a second plurality of trenches extending downward from said surface of said at least one dielectric layer, wherein said second plurality of trenches has said second pitch.

26. The method of claim 23, wherein a vertical sidewall of said one of said plurality of conductive lines is adjoined to a vertical end wall of one of said plurality of conductive lines.

* * * * *